US008968019B2

(12) United States Patent
Hack et al.

(10) Patent No.: US 8,968,019 B2
(45) Date of Patent: Mar. 3, 2015

(54) FOLDING SO-DIMM SOCKET

(71) Applicant: Apple Inc., Cupertino, CA (US)

(72) Inventors: Paul J. Hack, San Jose, CA (US);
Joshua Funamura, San Jose, CA (US);
George V. Anastas, San Carlos, CA (US); Zheng Gao, San Jose, CA (US);
Gregory A. Springer, Orinda, CA (US);
Erik James Shahoian, Sonoma, CA (US)

(73) Assignee: Apple Inc., Cupertino, CA (US)

( * ) Notice: Subject to any disclaimer, the term of this patent is extended or adjusted under 35 U.S.C. 154(b) by 171 days.

(21) Appl. No.: 13/657,329

(22) Filed: Oct. 22, 2012

(65) Prior Publication Data

US 2013/0288492 A1    Oct. 31, 2013

Related U.S. Application Data

(60) Provisional application No. 61/654,809, filed on Nov. 29, 2011.

(51) Int. Cl.
| H01R 13/62 | (2006.01) |
| H05K 7/14 | (2006.01) |
| G06F 1/18 | (2006.01) |

(52) U.S. Cl.
CPC ............. *H05K 7/1402* (2013.01); *G06F 1/185* (2013.01); *H05K 7/1408* (2013.01); *H05K 7/1409* (2013.01)
USPC ........................................................ 439/326

(58) Field of Classification Search
CPC ..................... H01R 23/7005; H01R 23/7068
USPC ........................... 439/326, 64, 377, 70
See application file for complete search history.

(56) References Cited

U.S. PATENT DOCUMENTS

| 4,274,693 | A | * | 6/1981 | Cobaugh et al. | 439/374 |
| 4,602,351 | A | * | 7/1986 | Shimamura et al. | 365/52 |
| 4,620,265 | A | * | 10/1986 | Lerude et al. | 361/816 |
| 4,756,694 | A | * | 7/1988 | Billman et al. | 439/61 |
| 4,820,186 | A | * | 4/1989 | Fujii | 439/326 |
| 4,898,540 | A | * | 2/1990 | Saito | 439/153 |
| 5,112,242 | A | * | 5/1992 | Choy et al. | 439/326 |
| 5,122,064 | A | * | 6/1992 | Zarreii | 439/65 |
| 5,267,872 | A | * | 12/1993 | Gou et al. | 439/326 |
| 5,337,220 | A | | 8/1994 | Granitz | |
| 5,411,408 | A | * | 5/1995 | DiViesti et al. | 439/326 |
| 5,437,560 | A | * | 8/1995 | Mizuguchi | 439/326 |
| 5,467,254 | A | | 11/1995 | Brusati et al. | |

(Continued)

OTHER PUBLICATIONS

Invitation to Pay Additional Fees mailed on Mar. 5, 2013 for PCT Patent Application No. PCT/US2012/066896, filed on Nov. 28, 2012, 5 pages.

(Continued)

*Primary Examiner* — Abdullah Riyami
*Assistant Examiner* — Vladimir Imas
(74) *Attorney, Agent, or Firm* — Kilpatrick Townsend & Stockton LLP

(57) ABSTRACT

Sockets that provide easy access for users to change cards while allowing the use of thinner device enclosures. One example provides a socket having two positions. When the socket is in an open state, the card may be oriented in a direction substantially away from the main logic board. When the socket is in a closed state, the card moves such that it is oriented at least closer to being in parallel to the main logic board.

35 Claims, 48 Drawing Sheets

(56) References Cited

U.S. PATENT DOCUMENTS

| | | | |
|---|---|---|---|
| 5,690,502 A * | 11/1997 | Mochizuki | 439/320 |
| 5,703,760 A | 12/1997 | Zhu | |
| 5,755,585 A * | 5/1998 | Cheng et al. | 439/326 |
| 5,803,761 A * | 9/1998 | Mochizuki | 439/326 |
| 5,833,478 A * | 11/1998 | Tseng et al. | 439/326 |
| 5,944,549 A * | 8/1999 | Po et al. | 439/326 |
| 5,993,234 A * | 11/1999 | Yodogawa | 439/326 |
| 6,030,245 A * | 2/2000 | Choy | 439/328 |
| 6,080,000 A * | 6/2000 | Baker et al. | 439/326 |
| 6,319,035 B1 * | 11/2001 | Choy | 439/326 |
| 6,340,308 B1 * | 1/2002 | Sugita | 439/326 |
| 6,341,971 B1 * | 1/2002 | Choy et al. | 439/326 |
| 6,431,890 B1 * | 8/2002 | Li et al. | 439/160 |
| 6,471,550 B2 * | 10/2002 | Maiterth et al. | 439/631 |
| 6,540,550 B2 * | 4/2003 | Chang et al. | 439/541.5 |
| 6,607,395 B2 * | 8/2003 | Hashimoto | 439/326 |
| 6,666,702 B1 * | 12/2003 | Pickles | 439/328 |
| 6,726,499 B1 * | 4/2004 | Yu | 439/328 |
| 6,772,246 B2 * | 8/2004 | Kim et al. | 710/62 |
| 6,802,732 B1 * | 10/2004 | Bu et al. | 439/328 |
| 6,821,144 B2 * | 11/2004 | Choy | 439/541.5 |
| 6,830,470 B1 * | 12/2004 | Lynch et al. | 439/326 |
| 6,869,302 B2 * | 3/2005 | Bricaud et al. | 439/326 |
| 7,029,306 B2 * | 4/2006 | Bilcauu et al. | 439/326 |
| 7,057,900 B2 * | 6/2006 | Roscoe et al. | 361/788 |
| 7,057,901 B2 * | 6/2006 | Roscoe et al. | 361/796 |
| 7,083,456 B2 * | 8/2006 | Trout et al. | 439/326 |
| 7,232,325 B2 * | 6/2007 | Richter et al. | 439/326 |
| RE39,784 E * | 8/2007 | Hsueh | 361/697 |
| 7,443,695 B2 * | 10/2008 | Roscoe et al. | 361/802 |
| 7,445,497 B2 * | 11/2008 | Zhang | 439/541.5 |
| 7,539,015 B2 * | 5/2009 | Springer et al. | 361/695 |
| 7,614,899 B2 * | 11/2009 | Zhu et al. | 439/325 |
| 7,677,907 B2 * | 3/2010 | Guan et al. | 439/157 |
| 7,682,179 B1 * | 3/2010 | Tsai | 439/326 |
| 7,789,668 B1 * | 9/2010 | Hamner et al. | 439/65 |
| 7,828,574 B2 * | 11/2010 | Zhu | 439/328 |
| 8,052,448 B2 * | 11/2011 | McKee | 439/326 |
| 8,419,478 B2 * | 4/2013 | Liu et al. | 439/631 |
| 2003/0007335 A1 | 1/2003 | Roscoe et al. | |
| 2004/0184243 A1 | 9/2004 | Mease et al. | |
| 2008/0278907 A1 | 11/2008 | Shih | |
| 2009/0034189 A1 * | 2/2009 | Springer et al. | 361/690 |
| 2011/0051342 A1 | 3/2011 | Crippen et al. | |

OTHER PUBLICATIONS

International Search Report and Written Opinion mailed on Jun. 19, 2013 for PCT Patent Application No. PCT/US2012/066896, filed on Nov. 28, 2012, 16 pages.

Chinese Office Action mailed on Mar. 18, 2013 for Chinese Patent Application No. 201220644510.9, with English Translation, 4 pages.

Chinese Office Action mailed on Jul. 3, 2013 for Chinese Patent Application No. 201220644510.9, with English Translation, 3 pages.

\* cited by examiner

FOLDING SO-DIMM SOCKET

CROSS-REFERENCES TO RELATED APPLICATIONS

This application claims the benefit of U.S. provisional patent application No. 61/564,809, filed Nov. 29, 2011, which is incorporated by reference.

BACKGROUND

Computers are a collection of many circuits acting together. These circuits may include central processing units, memories, graphics processors, networking circuits, and others. Many of these, such as the central processing unit, may be connected to a main or motherboard, also known as a main logic board. Other circuits, such as memories and graphics processors, may reside on separate boards, also known as daughter boards or cards, that connect to the main logic board. This connection is often made using a socket, where the socket is fixed to the main logic board and the memories or graphics processors are inserted into the socket.

These daughter boards or cards are typically inserted into these sockets such that they are orthogonal to the main logic board. This configuration makes it relatively easy for a user to pull cards and insert new ones. For example, this configuration may make it easy for users to upgrade cards or replace defective cards. This configuration also reduces the footprint or area on the main logic board consumed by the card.

This arrangement works well in traditional desktop computers, which typically have relatively large and wide enclosures. But some newer, cutting-edge computers may have thinner, sleeker, device enclosures. For example, some all-in-one desktops may have thinner device enclosures.

With these thinner computers, there may not be room for these conventional sockets. Put another way, using sockets where a card is orthogonal to a main logic board may limit how thin a device enclosure can be made.

Thus, what is needed are new sockets that provide easy access for users to change cards while allowing the use of thinner device enclosures.

SUMMARY

Accordingly, embodiments of the present invention may provide sockets that provide easy access for users to change cards while allowing the use of thinner device enclosures. An illustrative embodiment of the present invention provides a socket having two positions. When the socket is in an open state, the card may be oriented in a direction substantially away from the main logic board. When the socket is in a closed state, the card moves such that it is oriented at least closer to being in parallel to the main logic board.

In an illustrative embodiment of the present invention, when the socket is in an open position, a card may be at a relatively large angle to the main logic board, that is, the card may be approximately orthogonal to the main logic board, or it may be within a few tens of degrees of being orthogonal to the main logic board. When the socket is in a closed position, the card may be at approximately a 45 degree angle to the main logic board, or within a few tens of degrees of a 45 degree angle to the main logic board.

When the socket is in the open position, users may insert or remove one or more cards, for example to upgrade one or more cards, or to replace a defective card. The socket may provide zero, or near-zero insertion force. In a specific embodiment of the present invention, dimples or cleats on a guide are arranged to fit in cutouts on a side of a card, such as a small-outline dual in-line memory module (SO-DIMM) card. Dimples may provide a slight insertion force that is reduced when the card is fully inserted, thereby providing a tactile response to the user, informing the user that the card is properly inserted. Cleats may stay out of the path of cards during insertion and may thus not provide such a tactile response.

When the desired card or cards are placed in the socket, the socket may be closed by pushing down on one or more levers. A slight force may be needed to push down on the lever, where the force places contacts in the socket under tension such that contact is made between contacts of the socket and contacts on the one or more cards. One or more other elements, such as springs or torsion springs, may be included to maintain the switch in an open position unless the switch is positively closed. The levers may have tabs that lock under a frame of the socket such that the levers may be held in place, thereby maintaining or locking the socket in a closed position. To open the socket, the levers may be pulled away from the frame of the socket. The spring force of the contacts and one or more other elements may act to force the socket into the open position once the levers are pulled away from the frame. In other embodiments of the present invention, the levers may include loops which accept tabs located on the frame. When the socket is closed, the levers and loops may be pushed away from the frame, then released to accept the tabs. To open the socket, the levers and loops may be pushed away from the frame thereby disengaging the loops and tabs. Again, spring forces may drive the socket to the open position.

In an illustrative embodiment of the present invention, openings at the frame, as well as guides may be used to ensure a proper insertion of the card. These openings and guides may each have a funnel-like opening near the top to simplify the insertion of the card. Again, the guides may include dimples or cleats that are arranged to fit in a cutout on a card. When the socket is closed, the dimples or cleats may hold cards place to prevent movement, particularly during shipping or other movement of the device. These guides may be made narrow to increase openings between the one or more cards in order to facilitate airflow for cooling purposes. In other embodiments of the present invention, instead of dimples, other locking features may be included. Again, in another illustrative embodiment of the present invention, cleats located on guides may be used. These cleats may be out of the path of cards when the cards are inserted. The cleats may fit in cutouts on the cards when the cards are properly inserted in the socket. If the cards are not properly seated, the socket may not close properly, which may alert a user that a card may need to be reseated.

Various embodiments of the present invention may include other features. For example, the levers may be modified to provide a more pleasant user experience. For example, thumb tabs that provide comfort and prevent slipping may be included at ends of the levers. Also, cross pieces, or stabilizing bars or portions, may be included to improve the mechanical stability of the socket, particularly in the rotation direction.

An illustrative embodiment of the present invention may employ contacts capable of conveying high-speed signals. These contacts may have serpentine shapes to provide a large amount of flexibility in a small area. These contacts may also have a large area to be encased in a plastic housing for mechanical support. The large areas may include depressed areas. These depressed areas may act to reduce capacitance between neighboring contacts, thereby improving signal quality.

Embodiments of the present invention may be used to provide sockets that may hold one or more cards. These cards may be memory cards, such as SO-DIMM cards. They may also be other types of cards, such as graphics cards, networking cards, audio cards, or other types of cards, boards, modules, or devices.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
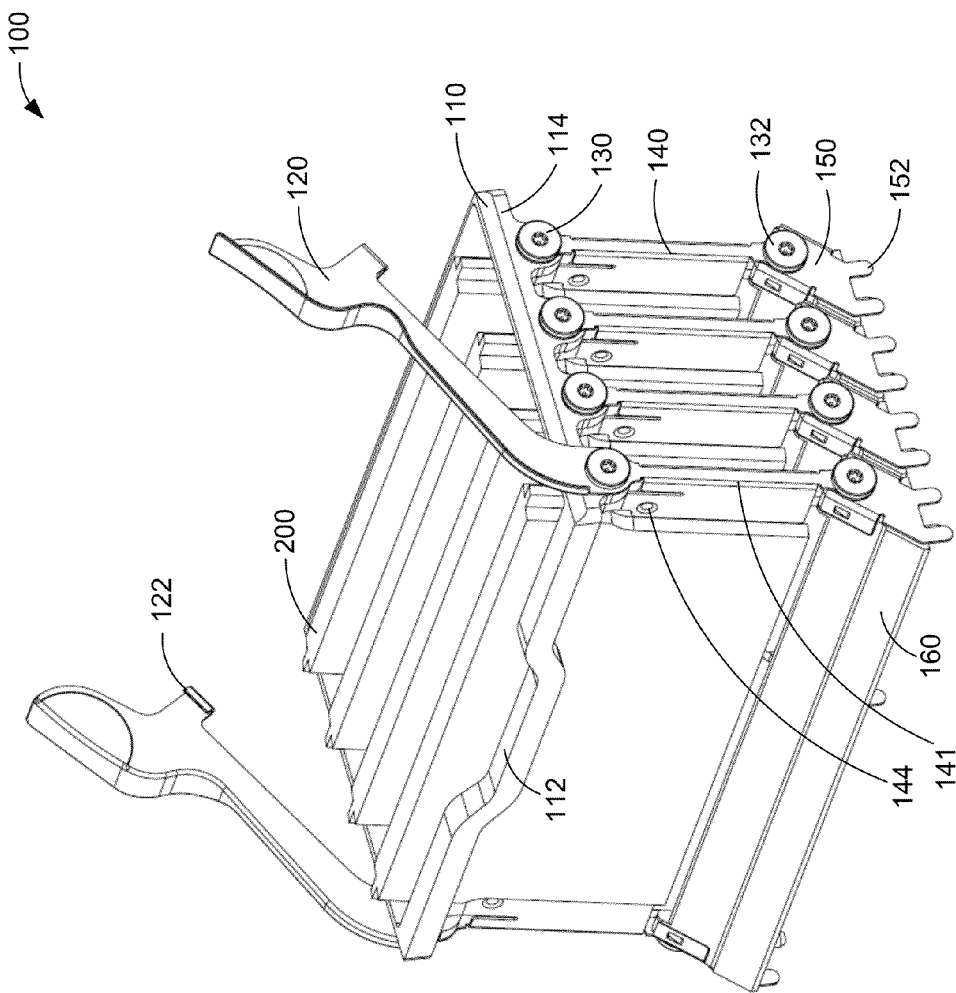
FIG. 1 illustrates a socket according to an embodiment of the present invention.

FIG. 1 illustrates a socket according to another embodiment of the present invention. This figure, as with the other included figures, is shown for illustrative purposes and does not limit either the possible embodiments of the present invention or the claims. Also, the description below may make reference to reference numbers in different figures. To maintain readability, this is not redundantly pointed for each occurrence.

Socket 100 may be used to provide electrical connections between one or more cards 200 and a board 300. Cards 200 may be memory cards, graphics cards, networking cards, or other types of cards. In a specific embodiment of the present invention, cards 200 may be SO-DIMM cards. In this specific embodiment of the present invention, socket 100 may hold four cards 200, though in other embodiments of the present invention, socket 100 may hold other numbers of cards.

Socket 100 may be in one of two states: open and closed. In the open state, as shown, one or more cards 200 may be removed or inserted by a user. Frame 110 may include depressed portion 112 to assist a user in grasping one or more cards 200 during insertion and extraction. In the open configuration, cards 200 may be substantially orthogonal to a board. That is, they may be within several tens of degrees within being orthogonal to a board. This angle may assist a user in insertion and extraction of cards 200.

In various embodiments of the present invention, socket 100 may provide zero, or near zero, insertion force. In a specific embodiment of the present invention, a small insertion force may be provided by dimple 144 arranged to fit in a cutout on card 200. This low insertion force is removed when a card is fully inserted and dimple 144 is fit in the cutout on card 200. This force removal may provide a tactile response to the user to indicate that card 200 is fully inserted in socket 100.

Socket 100 may include one or more levers 120. Levers 120 may be used to close socket 100. Specifically, levers 120 may be pushed in a downward direction such that tabs 122 on levers 120 fit under frame 110 at point 114. Springs, such as torsion springs, may be used to help maintain the socket in position when it is opened. Spring force from contacts may also assist in this.

Levers 120 may be attached through frame 110 to guides 140. In a specific embodiment of the present invention, lever 120 and guide 141 may be formed of a single piece, though in other embodiments they may be two pieces. Guides 140 may be attached between frame 110 and one or more receptacles 160. Contacts located in receptacles 160 may form electrical connections between contacts (not shown) on cards 200 and a board. Guide 140 may be connected to frame 110 and receptacles 160 by pivot points 130 and 132. Covers 150 may provide mechanical support for a connection between receptacles 160 and a board using tabs 152.

Figure 2:
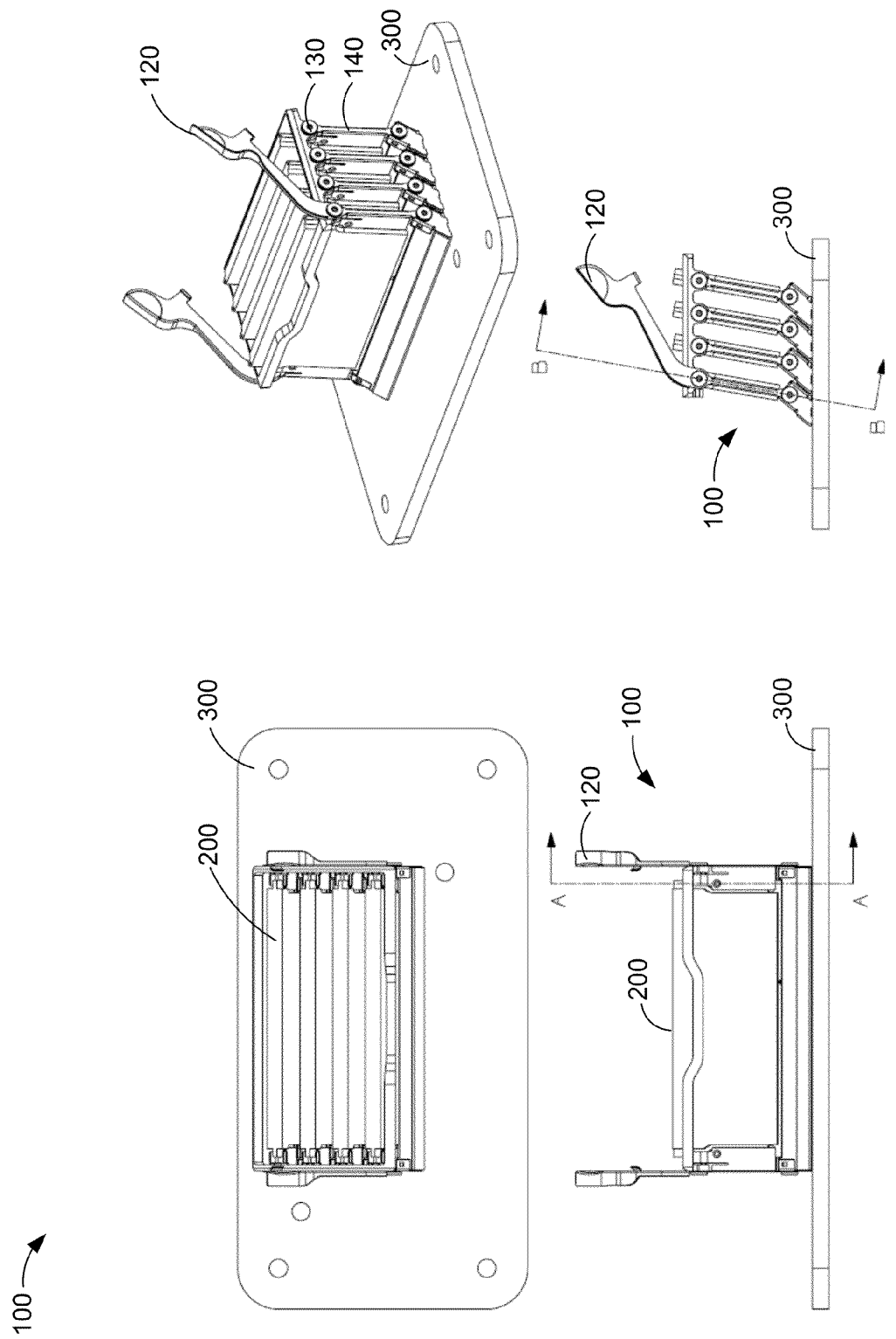
FIG. 2 illustrates top, oblique, front, and side views of a socket according to an embodiment of the present invention.

FIG. 2 illustrates top, oblique, front, and side views of a socket according to an embodiment of the present invention. As can be seen, in an open state, levers 120 are up away from frame 110, and cards 200 are substantially orthogonal to board 300. Board 300 may be a main logic board, or other type of a printed circuit board. In this and the following examples, only a portion of main logic board 300 is shown. In this specific example, when socket 100 is the open state, cards 200 are approximately 10 degrees away from being orthogonal to board 300.

Figure 3:
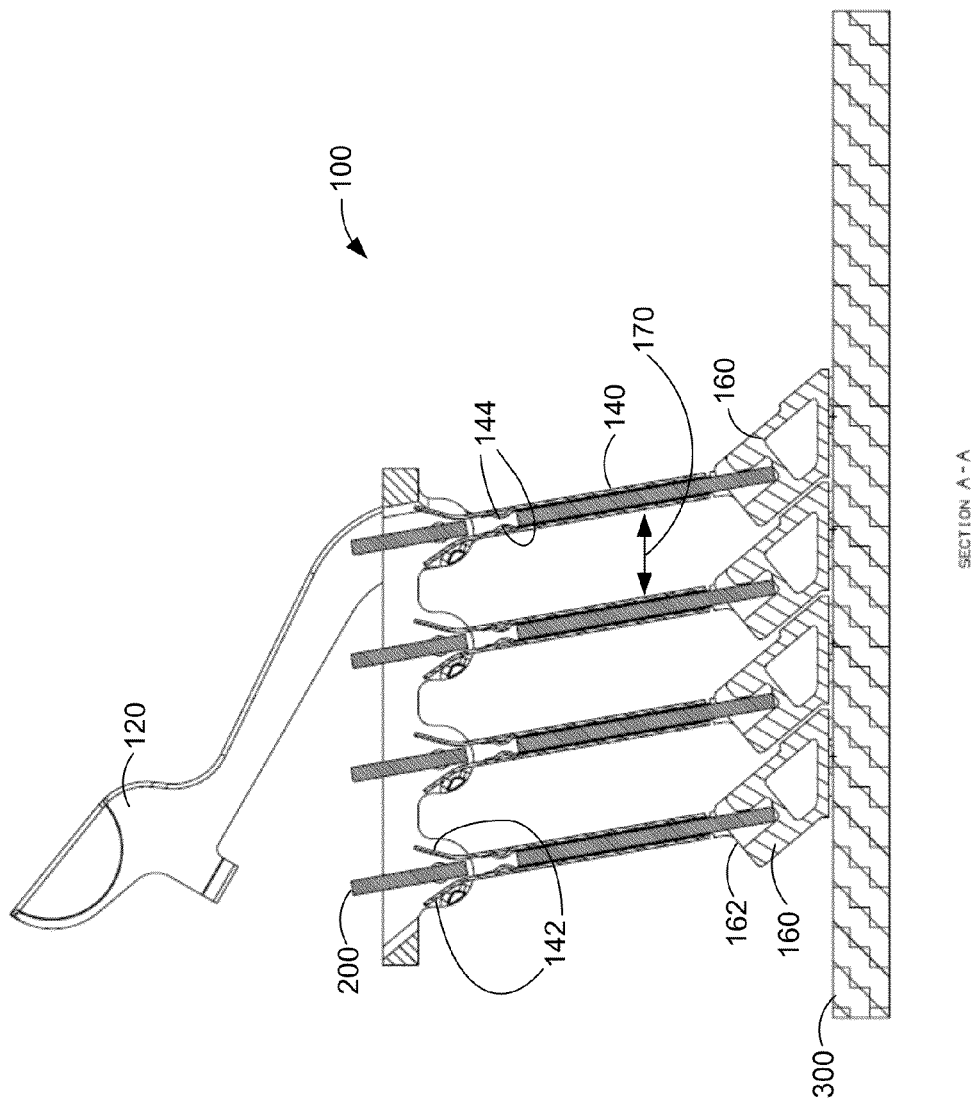
FIG. 3 illustrates a cut-away side view of a socket according to an embodiment of the present invention.

FIG. 3 illustrates a cut-away side view of a socket according to an embodiment of the present invention. In this example, cards 200 may be held by guides 140 and are inserted into receptacles 160 through openings 162. Frame 110 may include openings, and guides 140 may include a funnel shaped top 142 for assisting a user and inserting card 200 into receptacle 160. Guide 140 may further include dimples 144. These dimples may be arranged to fit in a cutout on a board 200. Dimples 144 may provide a small insertion force during insertion of card 200 until the cutout on card 200 reaches dimples 144. This may provide a tactile response to inform a user that card 200 is fully inserted in socket 100.

It should also be noted that guides 140 may be relatively narrow, such that opening 170 may be relatively large. This large opening may aid in airflow and therefore may improve the removal of heat from circuits on cards 200.

Figure 4:
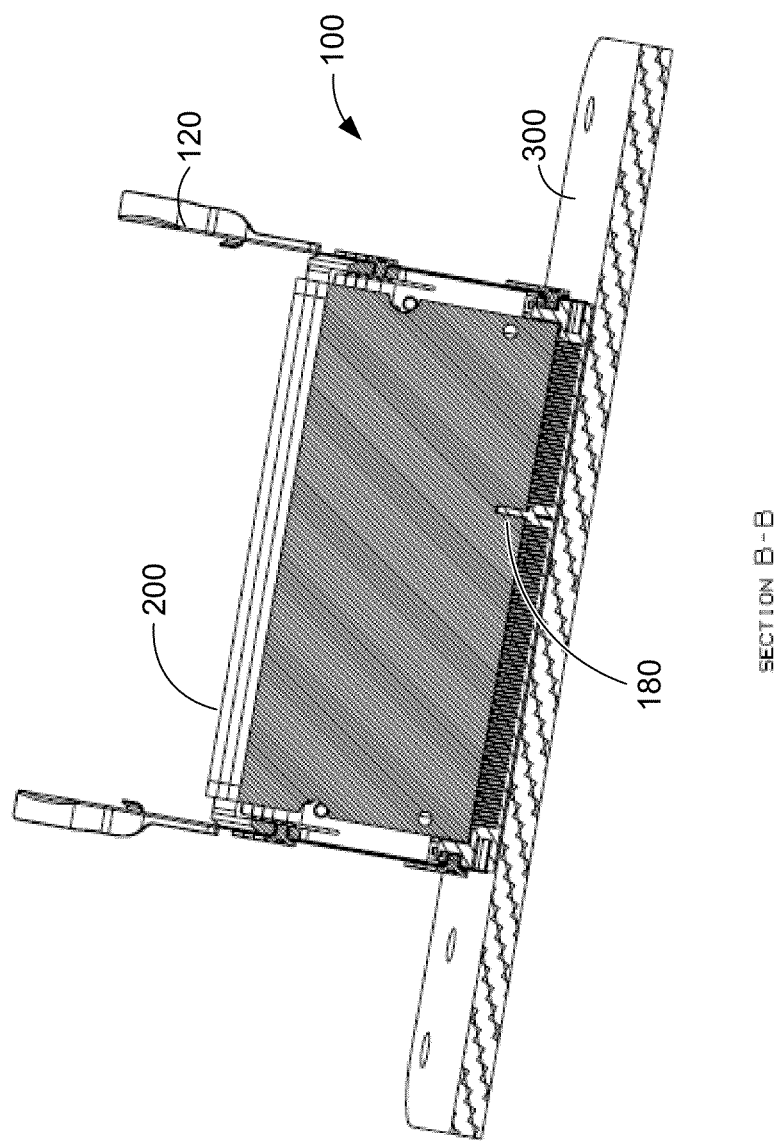
FIG. 4 illustrates a front cut-away view of a socket according to an embodiment of the present invention.

FIG. 4 illustrates a front cut-away view of a socket according to an embodiment of the present invention. This figure illustrates keying feature 180, which may be used to prevent an upside down insertion of card 200.

Figure 5:
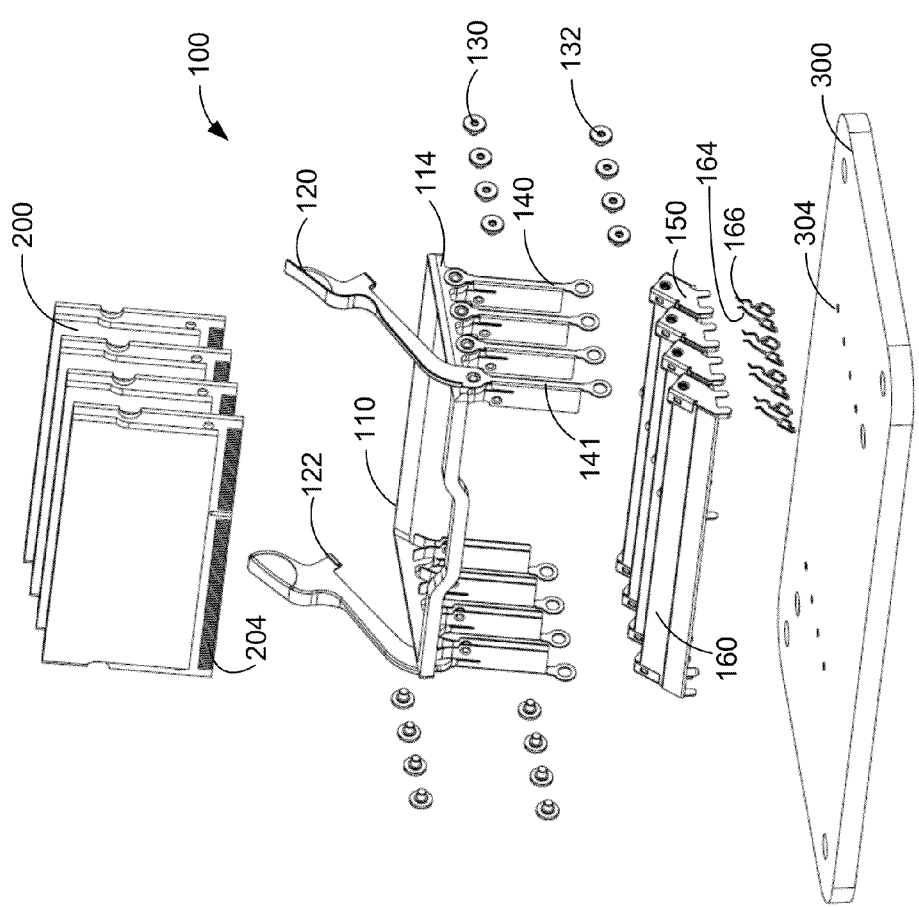
FIG. 5 illustrates an exploded view of a socket according to an embodiment of the present invention.

FIG. 5 illustrates an exploded view of a socket according to an embodiment of the present invention. In this figure, socket 100 is in an open state. This figure also includes cards 200 and board 300. Again, guides 140 may attach to frame 110 at a first end and receptacles 160 at a second end. In a specific embodiment of the present invention, lever 120 and guide 141 may be one piece, though in other embodiments of the present invention, they may be formed using two individual pieces. Guides 140 may pivot relative to frame 110 and receptacles 150 at pivot points 130 and 132. Receptacles 160 may include covers 150 and contacts 164 and 166. Contacts 164 and 166 may form electrical connections between contacts 204 on cards 200 and contacts 304 on board 300.

Again, socket 100 may be closed by pushing down on levers 120. The downward motion of levers 140 may cause guide 141, to which is attached, to rotate clockwise as shown in the figure. This, in turn, may cause frame 110 to move forward and down, which may cause the other guides 140 to similarly rotate in a clockwise fashion. Tabs 122 on levers 120 may fit under frame 110 at points 114. Levers 120 may be biased inward such that tabs 122 stay under frame 110 when socket 100 is in the closed position. Examples of a socket in the closed position are shown in the following figures.

Figure 6:
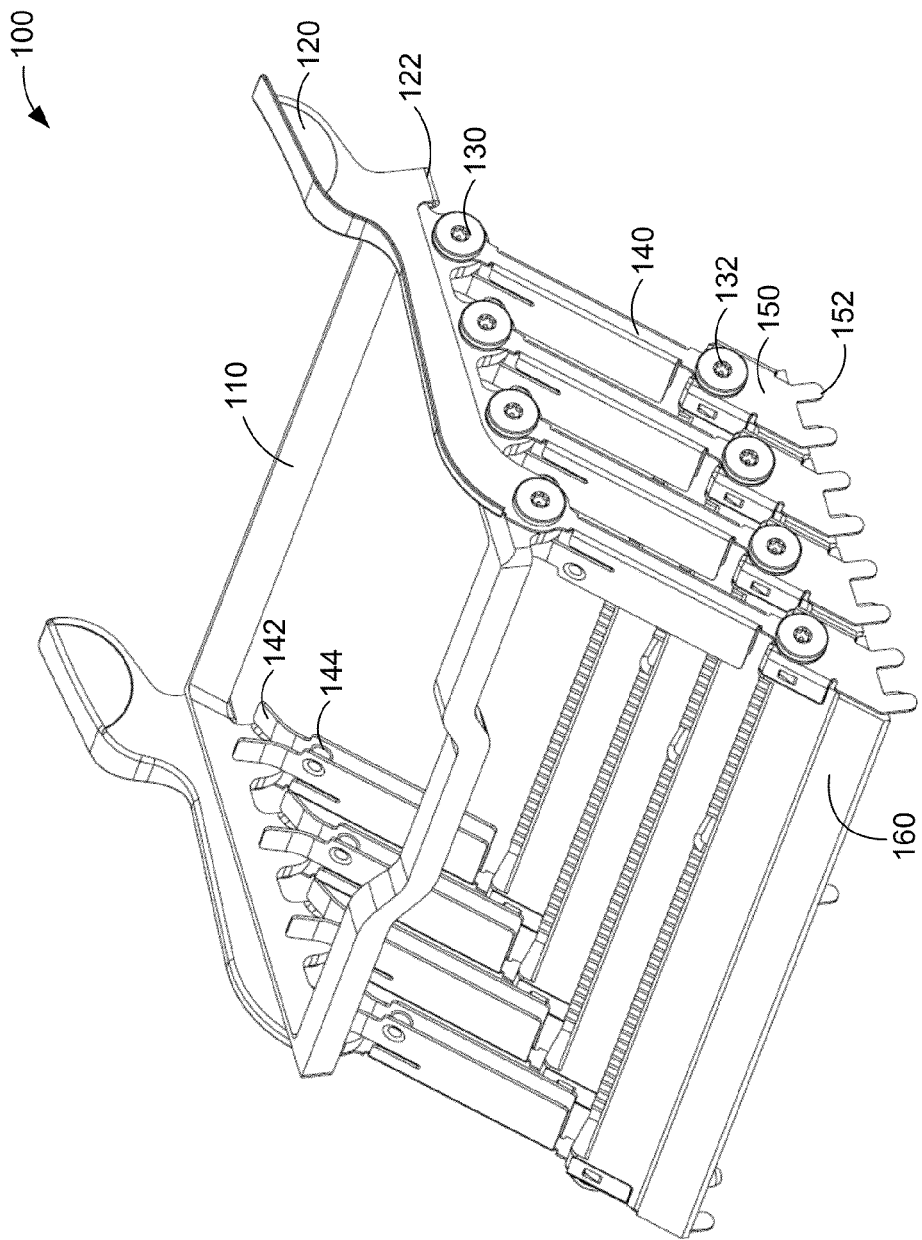
FIG. 6 illustrates a socket in a closed position according to an embodiment of the present invention.

FIG. 6 illustrates a socket in a closed position according to an embodiment of the present invention. Again, tabs 122 on levers 120 fit under frame 110. Guide 140 may attach between frame 110 and receptacles 160 at pivot points 130 and 132. Guides 140 may further include a funnel-shaped top 142 and dimples 144. Receptacle covers 150 may provide mechanical support between receptacles 160 and a board via tabs 152.

Figure 7:
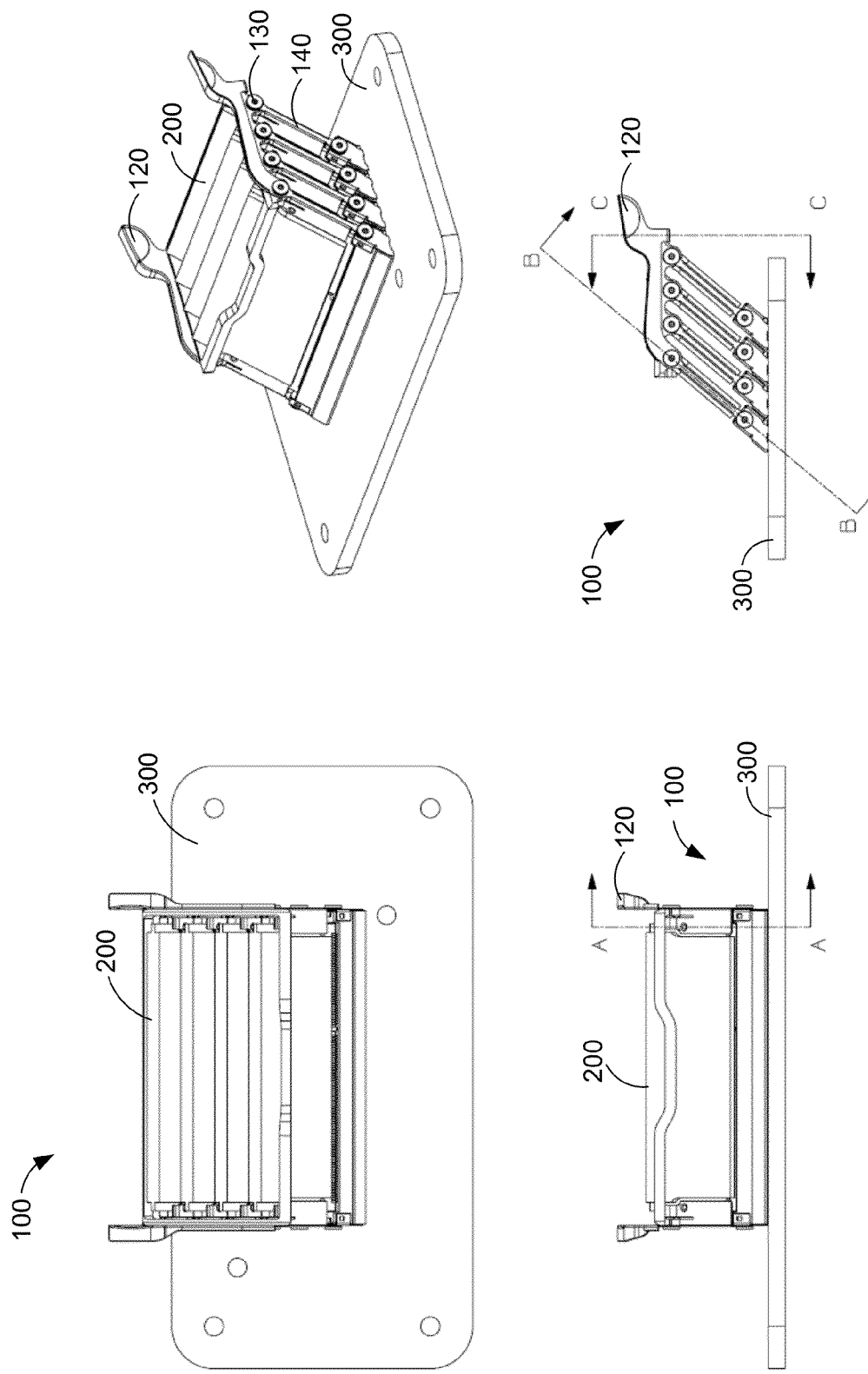
FIG. 7 illustrates top, oblique, front, and side views of a socket in a closed state according to an embodiment of the present invention.

FIG. 7 illustrates top, oblique, front, and side views of a socket in a closed state according to an embodiment of the present invention. As can be seen, when socket 100 is closed, cards 200 move substantially in a direction towards being in parallel with board 300. In this example, cards 200 move to approximately a 45 degree angle to board 300, though in other embodiments of the present invention, cards 200 may be within several tens of degrees of a 45 degree angle to board 300.

Figure 8:
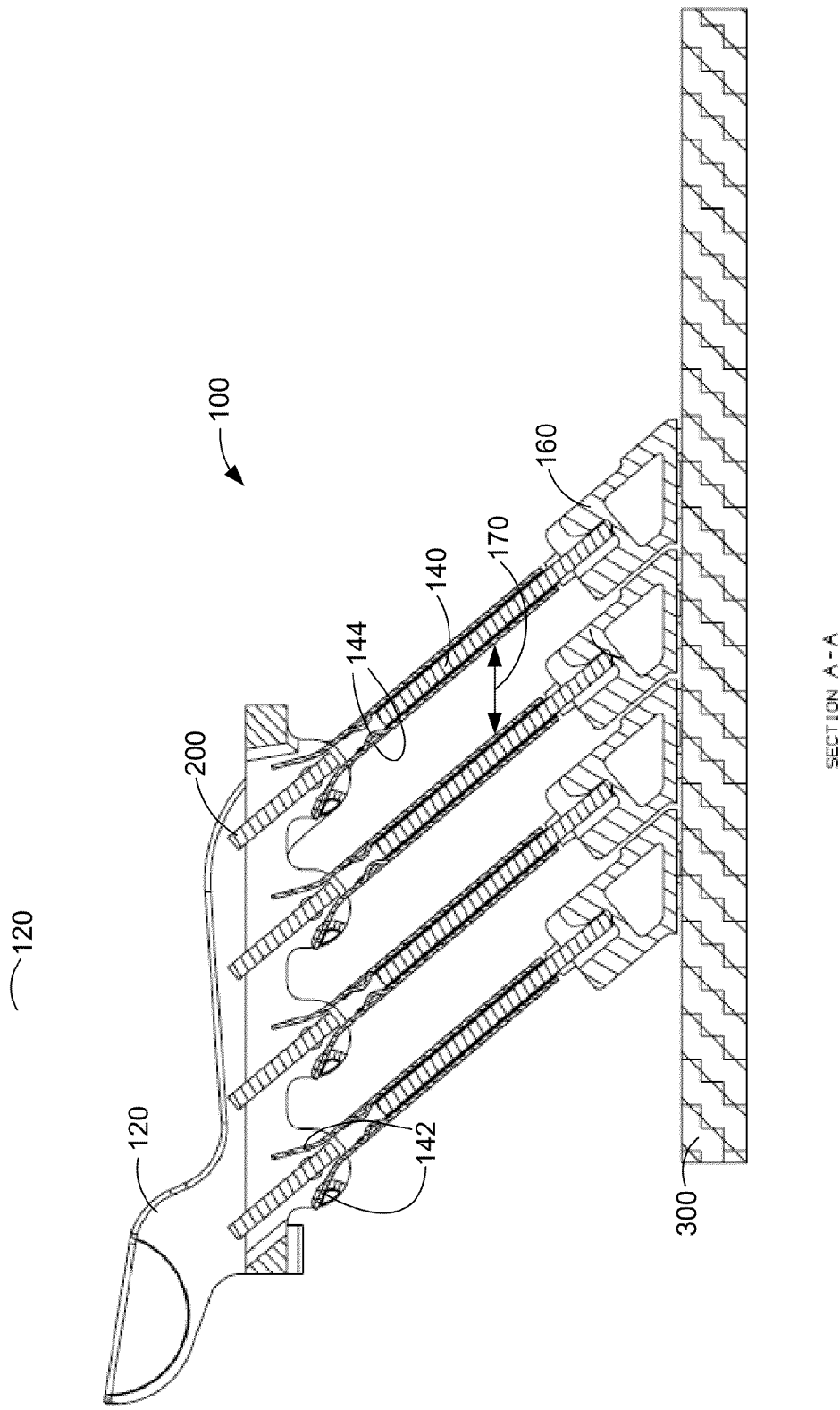
FIG. 8 illustrates a cut-away side view of a socket according to an embodiment of the present invention.

FIG. 8 illustrates a cut-away side view of a socket according to an embodiment of the present invention. Again, guides 140 may include a funnel-shaped top 142 and dimples 144. Spacing 170 may be relatively large to improve airflow and heat removal from circuitry on cards 200.

Figure 9:
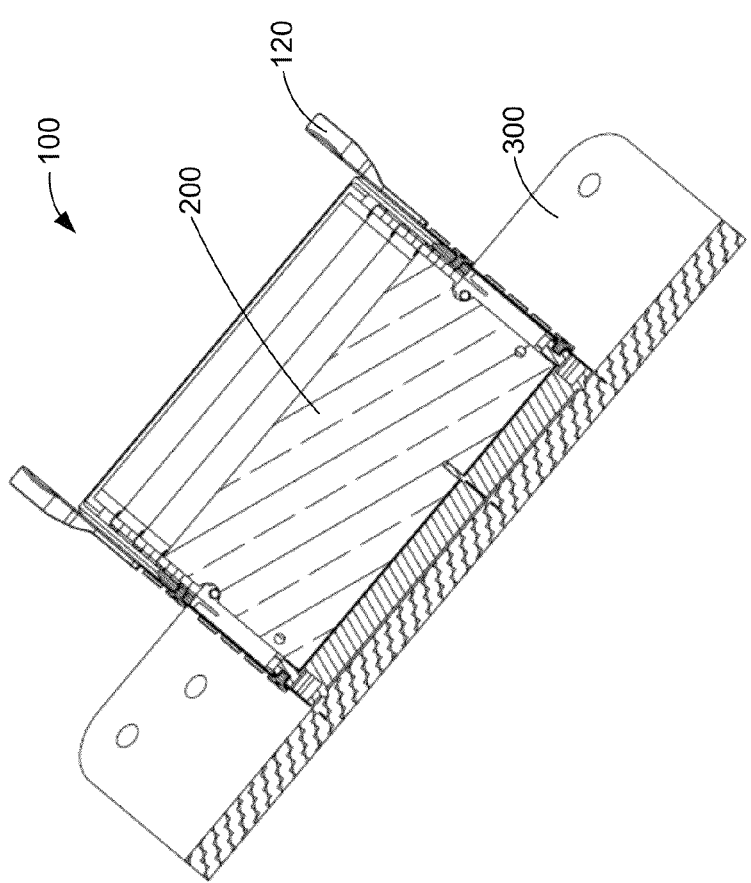
FIG. 9 illustrates a cut-away front view of a socket in a closed position according to an embodiment of the present invention.

FIG. 9 illustrates a cut-away front view of a socket in a closed position according to an embodiment of the present invention.

Figure 10:
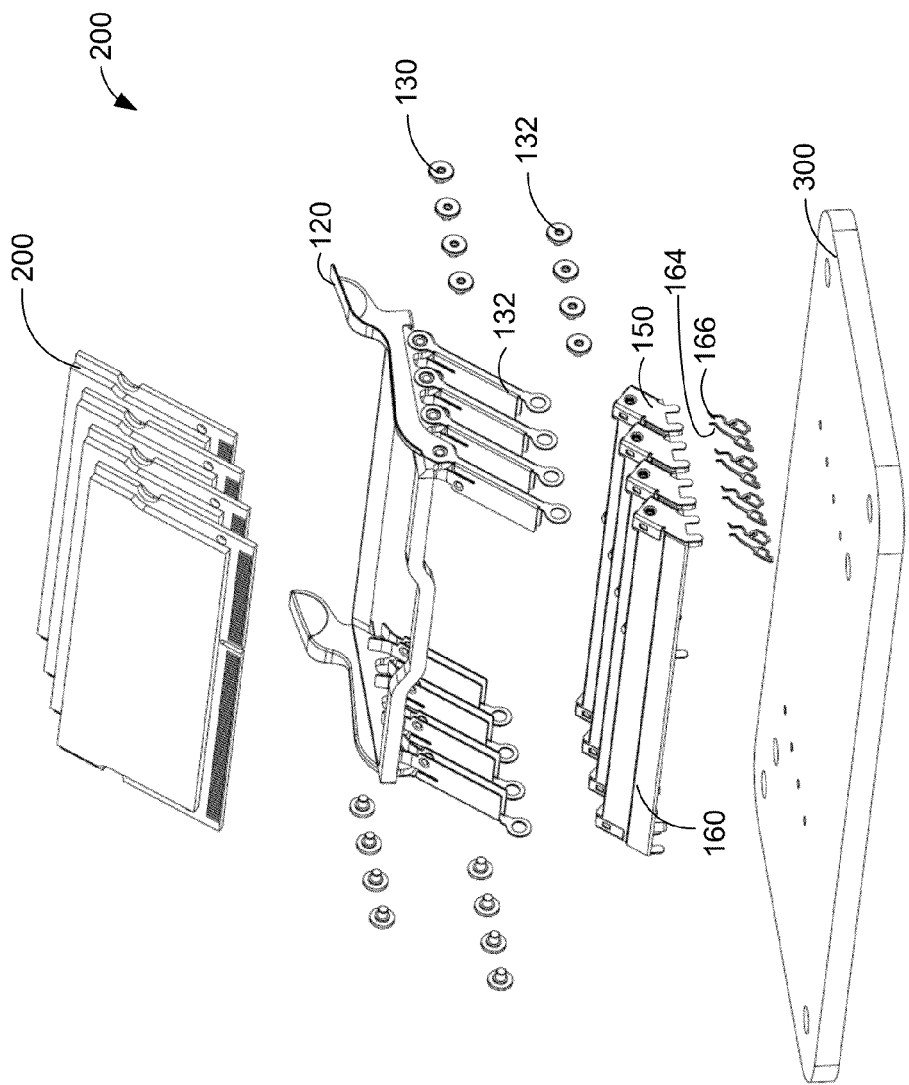
FIG. 10 illustrates an exploded view of a socket in a closed position according to an embodiment of the present invention.

FIG. 10 illustrates an exploded view of a socket 100 in a closed position according to an embodiment of the present invention.

Sockets according to an embodiment of the present invention may be considered to have three main portions. A first portion may include frame 110 and levers 120. The relative position of frame 110 and levers 120 dictates whether the socket is an open or closed position. The second portion may be considered to be guides 140, which connect frame 110 to receptacles 160. As described above, guides 140 may include funnel top 142 and dimples 144. The third portion, receptacles 160, include openings for accepting ends of cards 200. They also may include contacts to form electrical connections between contacts on cards 200 and board 300. Receptacles according to embodiments of the present invention are shown in the following figures.

Figure 11:
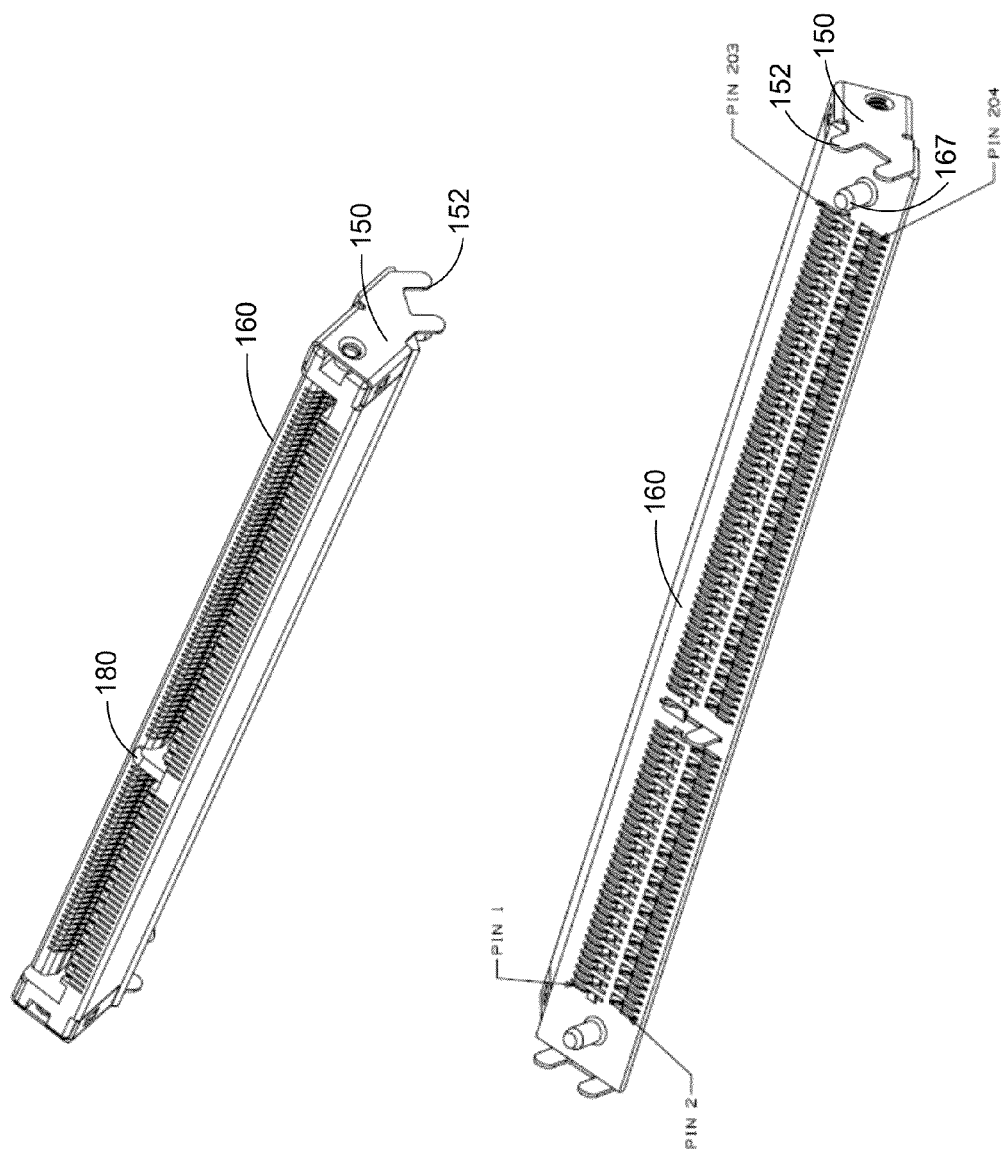
FIG. 11 illustrates a receptacle according to an embodiment of the present invention.

FIG. 11 illustrates a receptacle according to an embodiment of the present invention. In this example, receptacle 160 may include keying feature 180 and covers 150. Covers 150 may further include tabs that may be soldered into a board for mechanical support. Receptacle 160 may further include tabs 167 that may be inserted into a board for further mechanical support.

Figure 12:
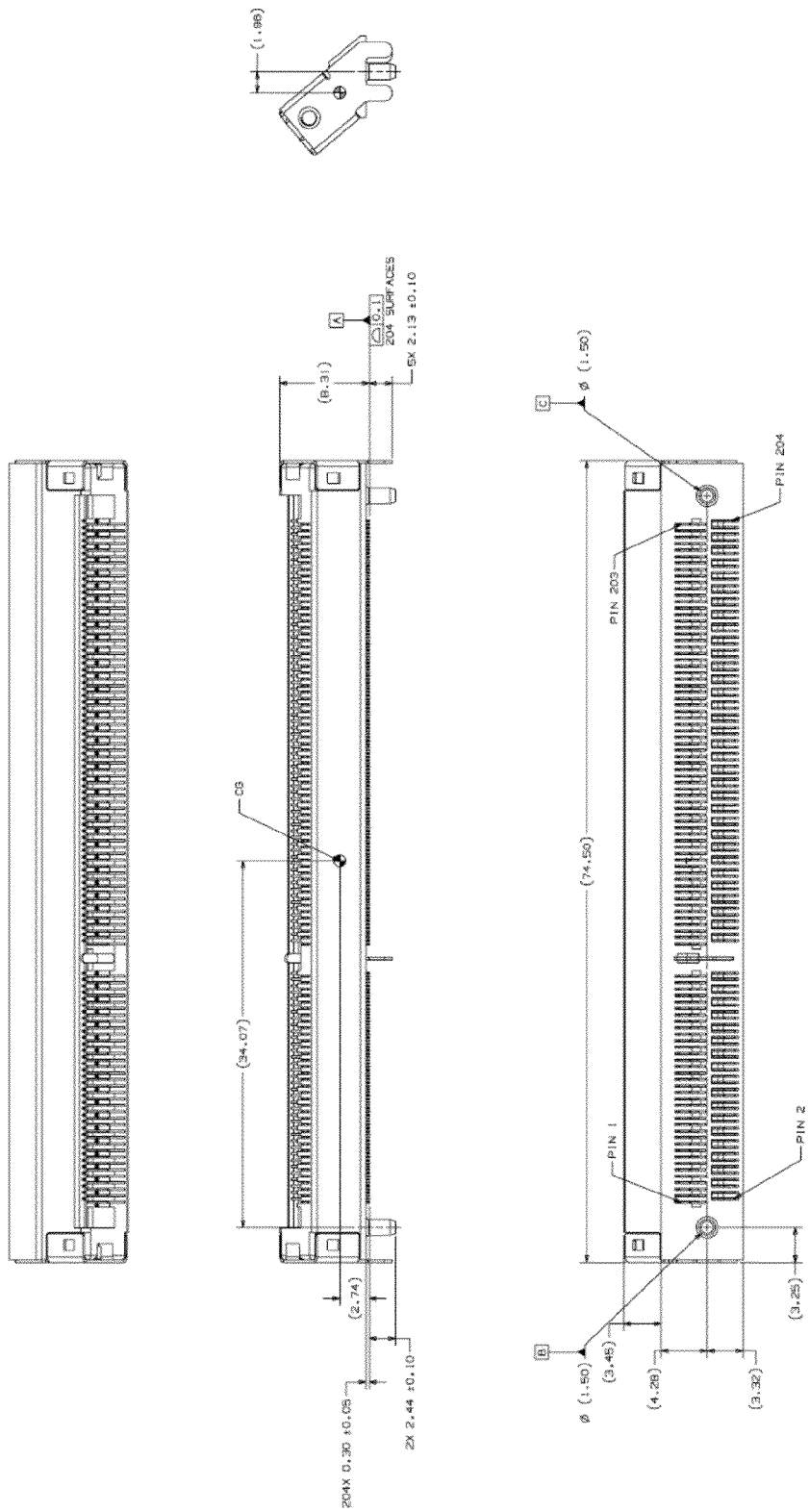
FIGS. 12 and 13 are mechanical diagrams of a receptacle according to an embodiment of the present invention.
Figure 13:
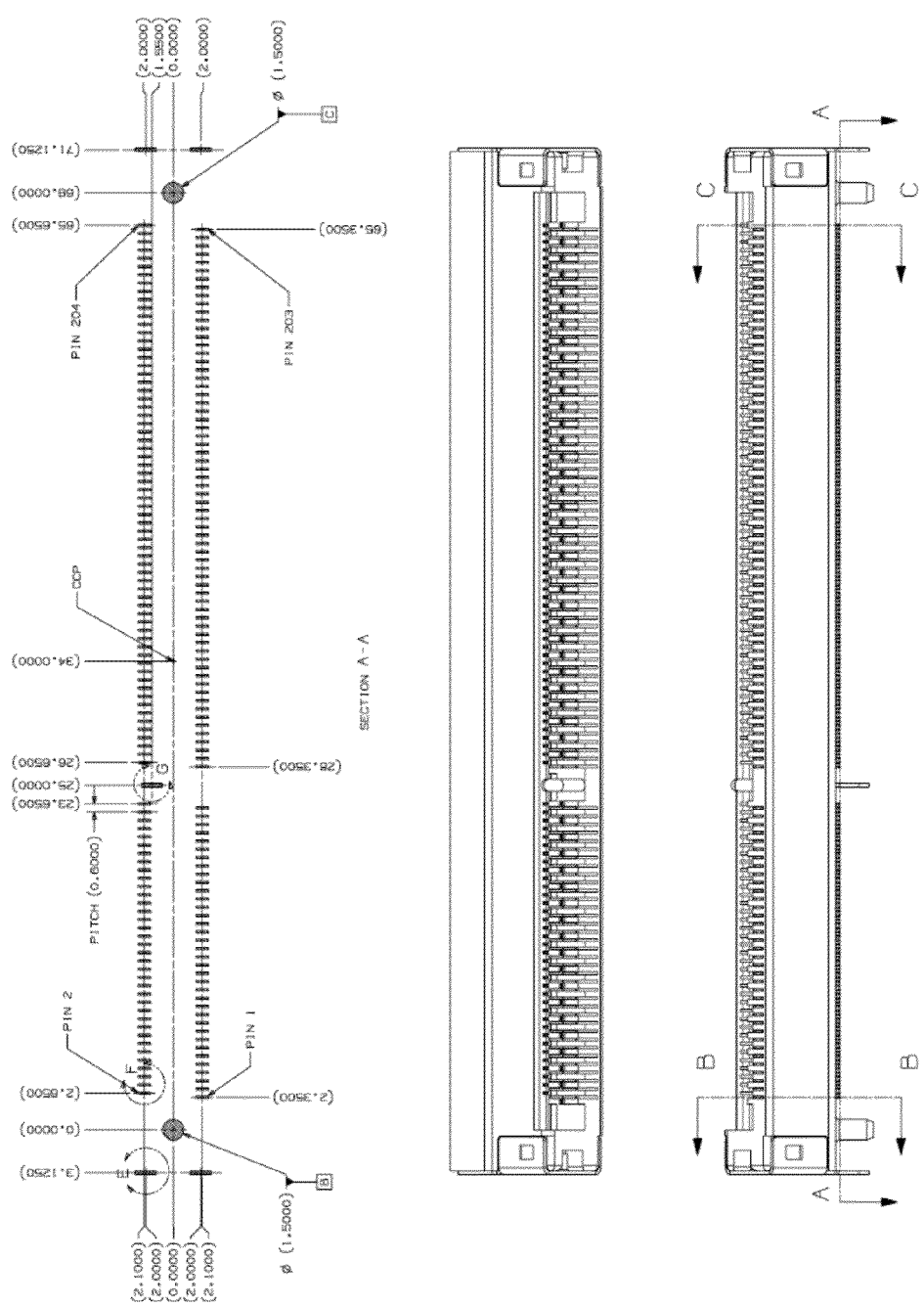

FIGS. 12 and 13 are mechanical diagrams of a receptacle according to an embodiment of the present invention.

Figure 14:
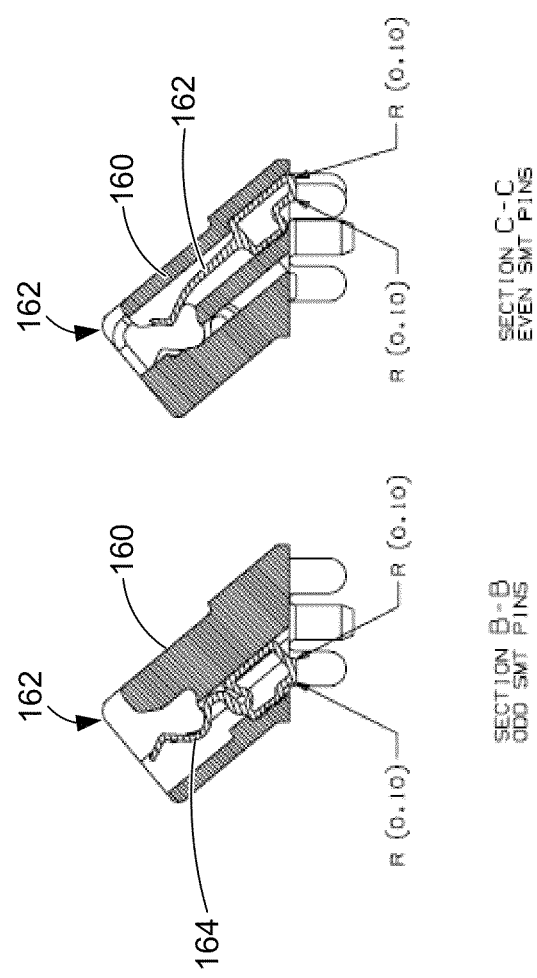
FIG. 14 illustrates cut-away views of a receptacle according to an embodiment of the present invention.

FIG. 14 illustrates cut-away views of a receptacle according to an embodiment of the present invention. These cut-away views show contacts 162 and 164. Contacts 162 and 164 may form electrical connections between contacts on cards 200 and contacts on a main logic board 300.

Figure 15:
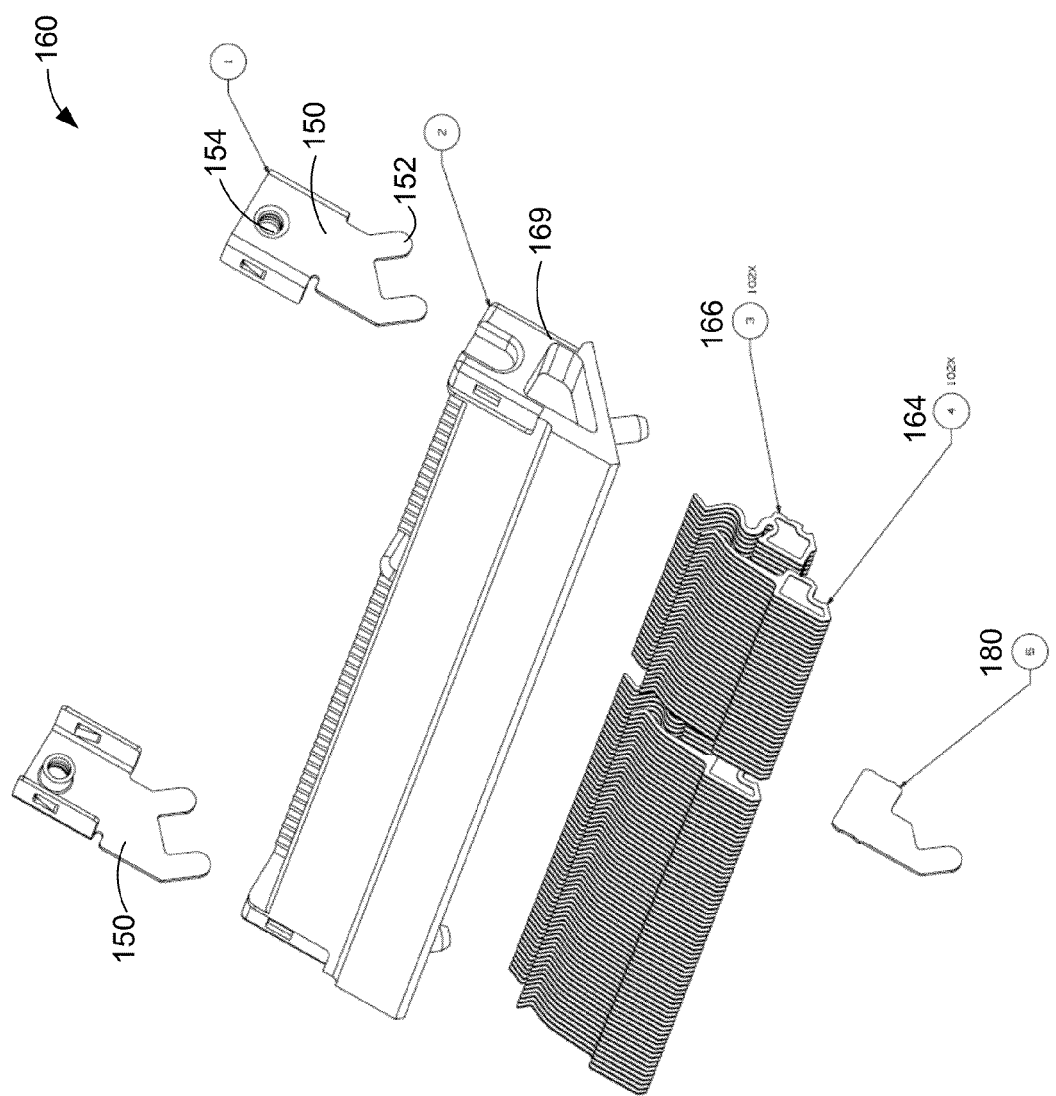
FIG. 15 illustrates an exploded view of a receptacle according to an embodiment of the present invention.

FIG. 15 illustrates an exploded view of a receptacle according to an embodiment of the present invention. Receptacle 160 includes housing 169, contacts 164 and 166, tab 182, and covers 150. Covers 150 may include openings 154 for pivot points, and tabs 152, which may be soldered into a board for mechanical support.

Figure 16:
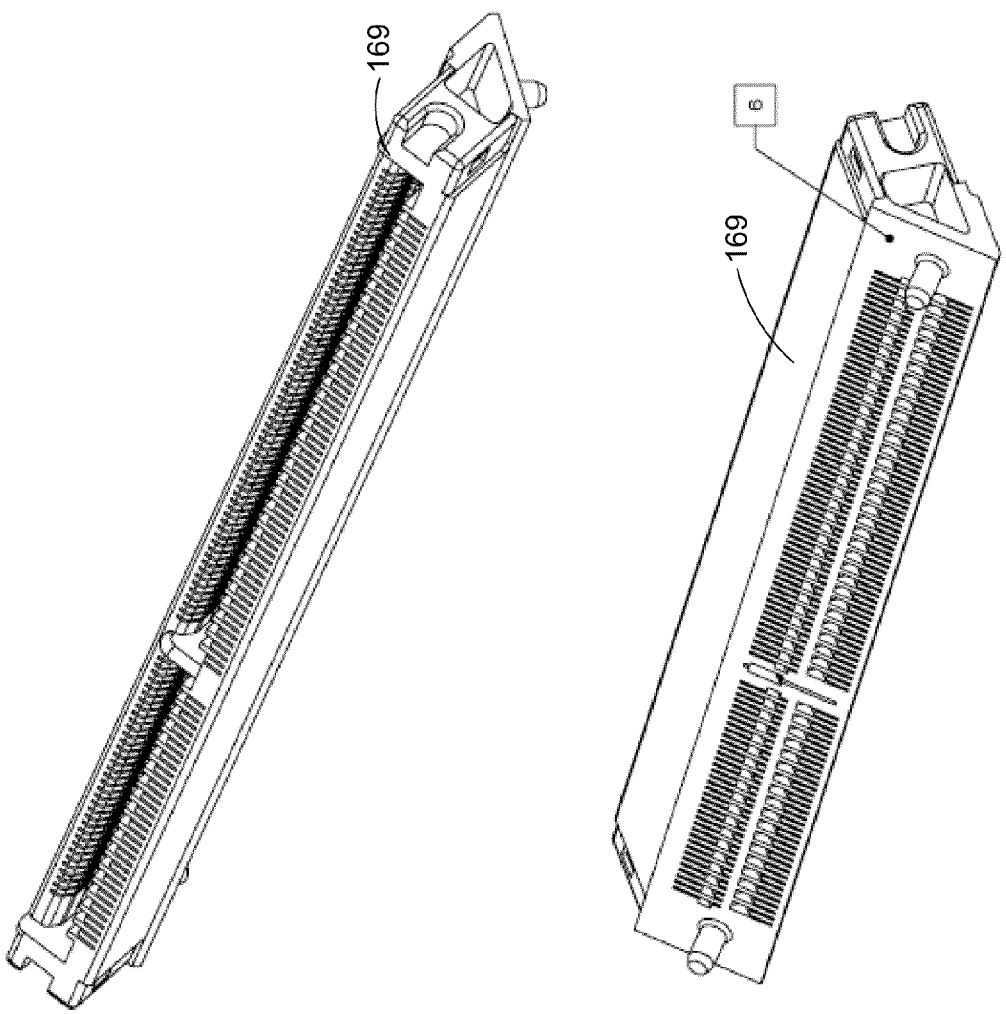
FIG. 16 illustrates a housing for a receptacle according to an embodiment of the present invention.

FIG. 16 illustrates a housing for a receptacle according to an embodiment of the present invention.

Figure 17:
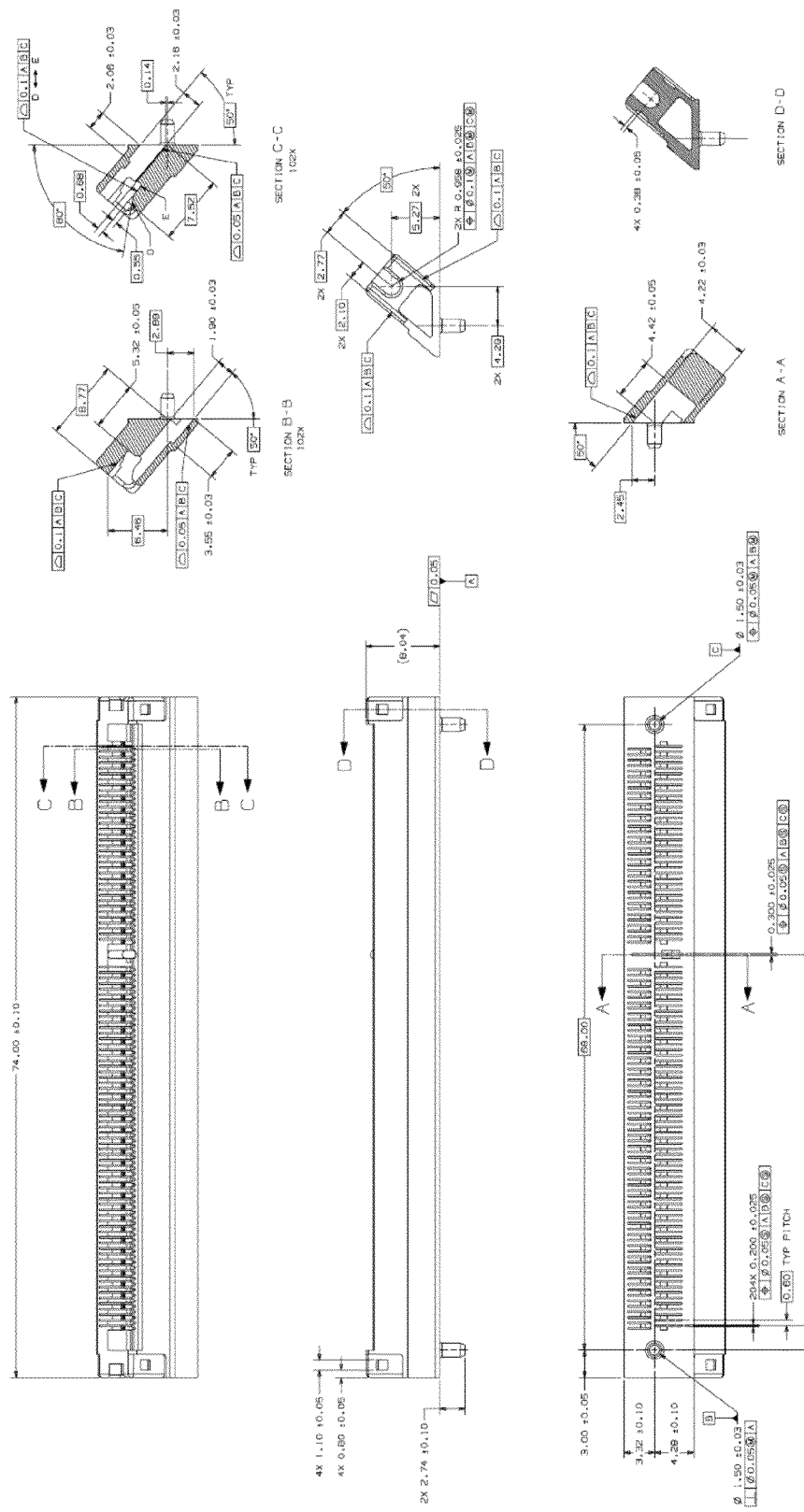
FIGS. 17 and 18 illustrate mechanical diagrams of a housing for a receptacle according to an embodiment of the present invention.
Figure 18:
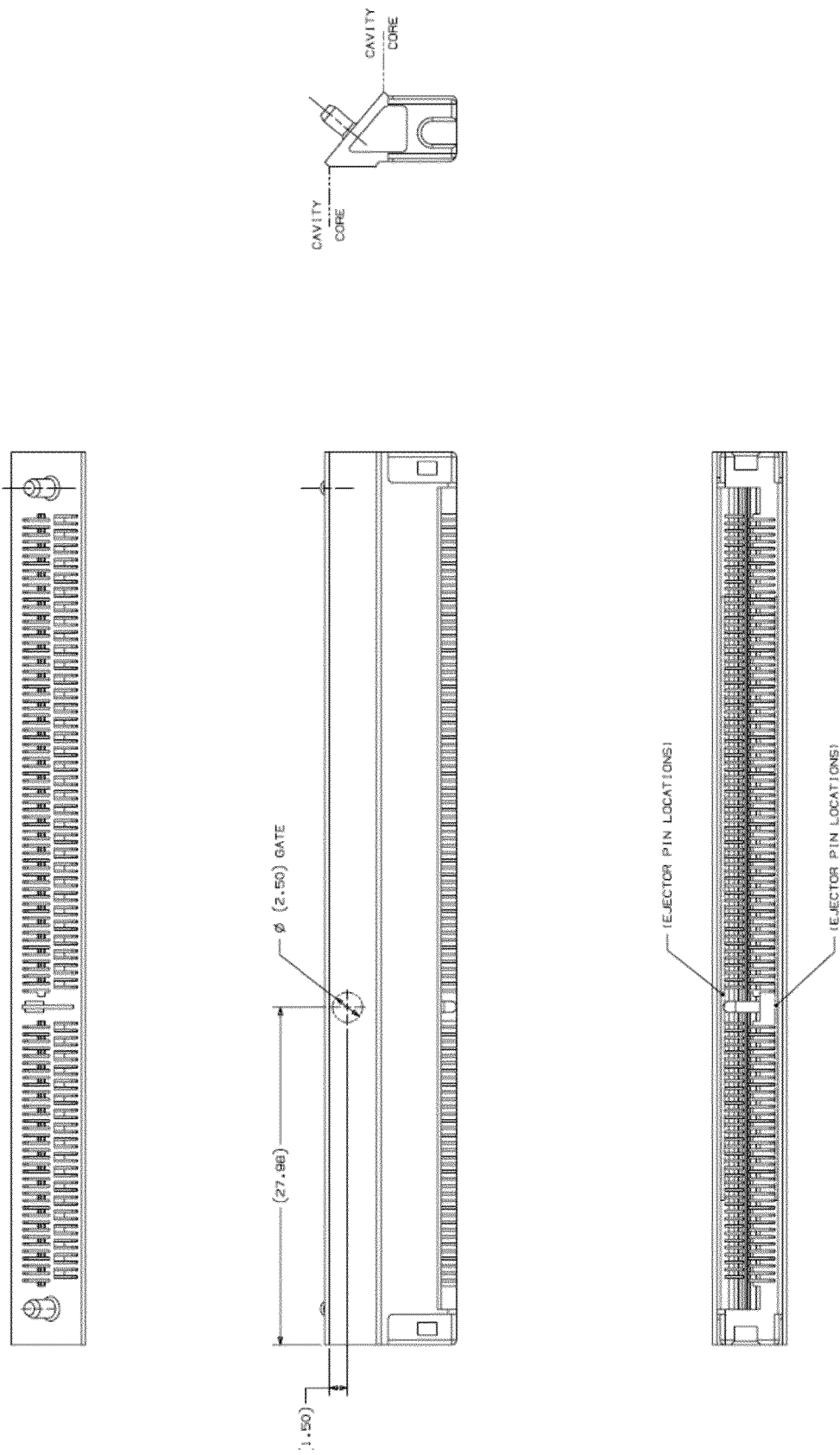

FIGS. 17 and 18 illustrate mechanical diagrams of a housing for a receptacle according to an embodiment of the present invention.

Figure 19:
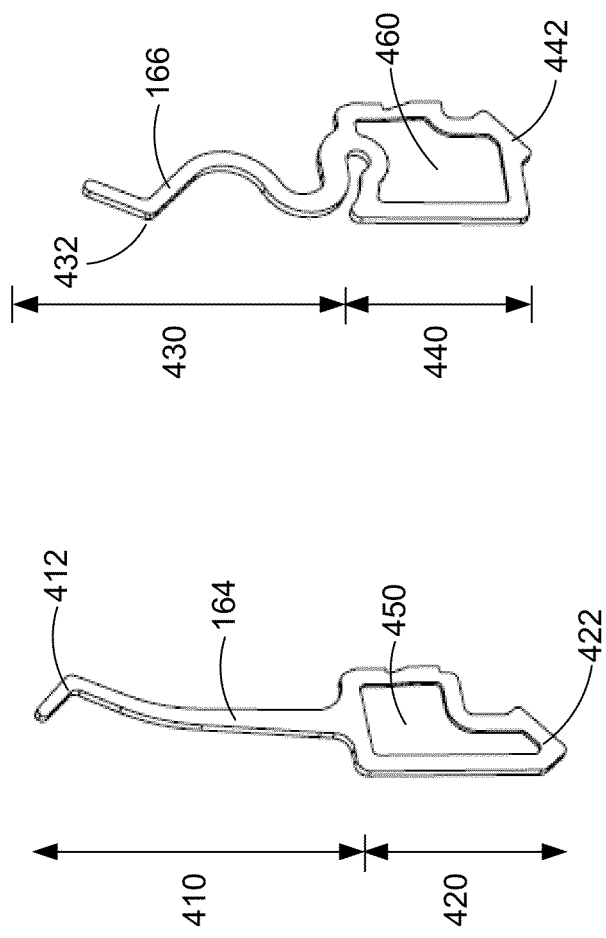
FIG. 19 illustrates contacts that may be used in a receptacle and a socket according to an embodiment of the present invention.

FIG. 19 illustrates contacts that may be used in a receptacle and a socket according to an embodiment of the present invention. Contacts 164 may include a serpentine portion 410. Serpentine portion 410 may include contact portion 412 to make an electrical connection with a contact on a card. Contact 164 may further include base portion 420. Base portion 420 may be substantially encased in a housing of the receptacle. Contact 164 may also include board contact 422 to form an electrical connection with a contact on a board. Board contact 422 may have a substantially flat edge for forming a good solder connection to a contact on a board.

Similarly, contact 166 includes a serpentine portion 430. Serpentine portion 430 may include contact portion 432 to form an electrical connection with a contact on a card. Contact 166 may further include base portion 420. Base portion 420 may be substantially encased in a housing of the receptacle. Contact 166 may also include board contact 442 to form an electrical connection with a contact on a board. Board contact 422 may have a substantially flat edge for forming a good solder connection to a contact on a board.

Contacts 164 and 166 may further include depressions 450 and 460. These depressions may be on one or both sides of contacts 164 and 166. These depressed areas may be machined, etched, or formed by another method. These depressions effectively increase the spacing between those portions of contacts 164 and 166. This, in turn, decreases capacitance between neighboring contacts and improves signal performance.

Serpentine portions 410 and 430 may be arranged to provide necessary flexibility such that a good electrical connection is maintained with contacts on card 200 (shown in FIG. 1 and others. Again, this description may make reference to reference numbers in different figures. To maintain readability, this is not redundantly pointed for each occurrence.) These serpentine shapes may also allow this flexibility and connection to be achieved in a small area. This smaller size may further improve signal quality and may allow socket 100 to handle high-speed signals.

Figure 20:
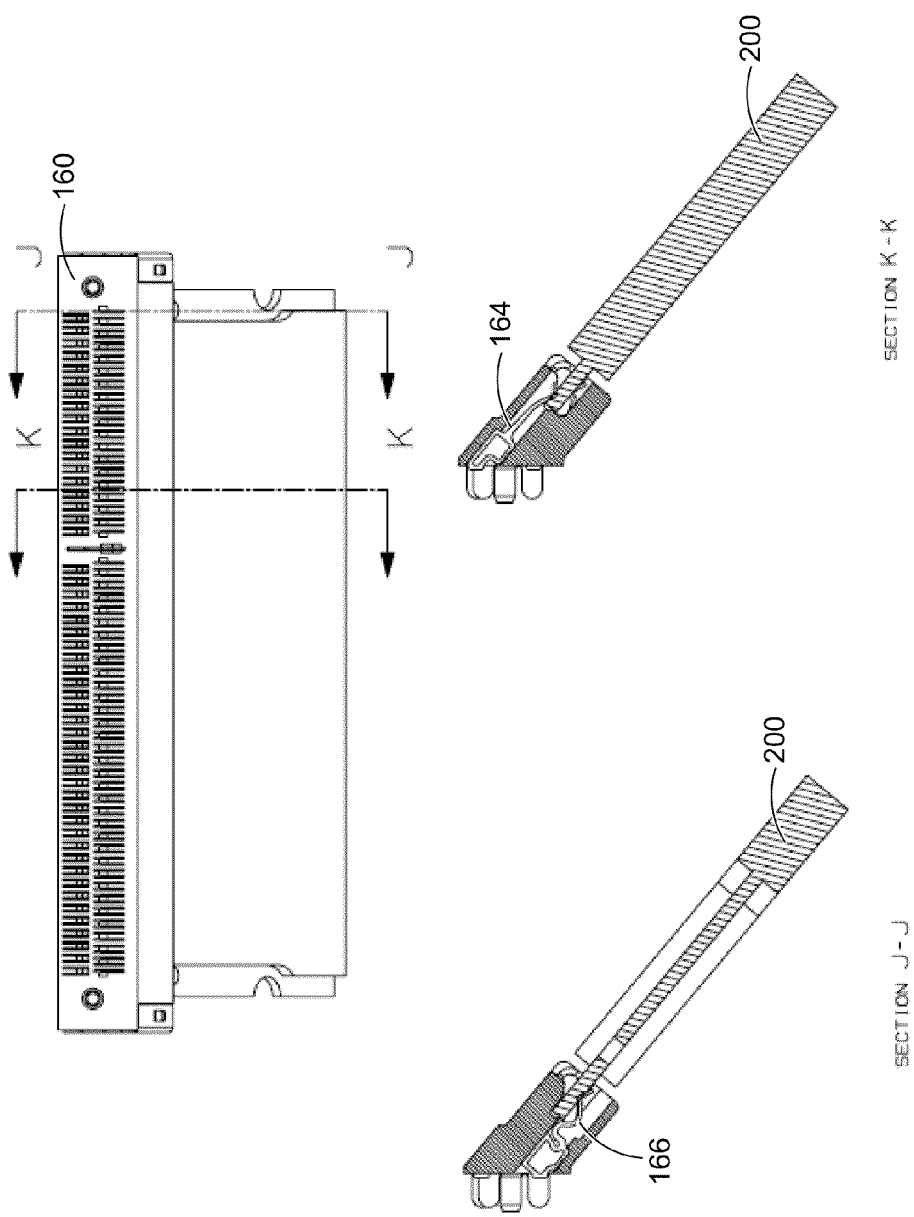
FIG. 20 illustrates cut-away views of a receptacle when a card is inserted in a closed position.

FIG. 20 illustrates cut-away views of receptacle 161 when card 200 is inserted in a closed position. As can be seen, contacts 164 and 166 may be deformed such that they may provide good electrical connections with contacts on card 200.

Figure 21:
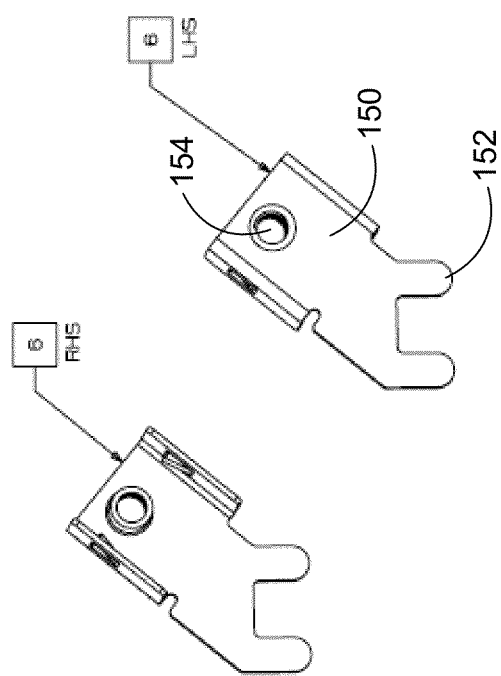
FIG. 21 illustrates receptacle covers according to an embodiment of the present invention.

FIG. 21 illustrates receptacle covers according to an embodiment of the present invention. Receptacle covers 150 may include tabs 152 and openings 154. Tabs may be inserted and soldered in board 300 to provide mechanical stability. Openings 154 may accept pivot points 130 and 132.

Figure 22:
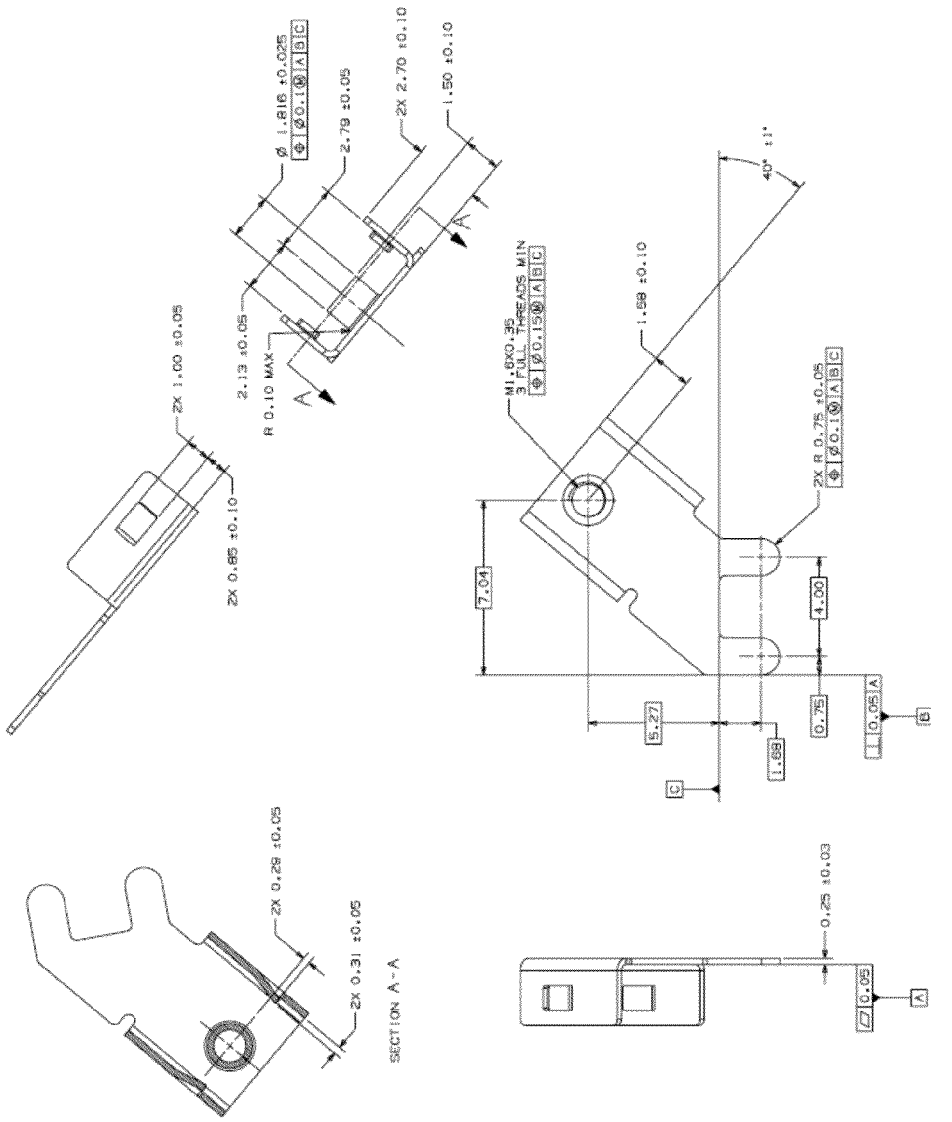
FIG. 22 is a mechanical diagram of a receptacle cover according to an embodiment of the present invention.

FIG. 22 is a mechanical diagram of a receptacle cover according to an embodiment of the present invention.

Various embodiments of the present invention may include other features. For example, levers 120 may be modified to provide a more pleasant user experience. Also, stabilizing bars or portions may be included to improve the mechanical stability of the socket. An example of such a socket is shown in the following figures.

Figure 23:
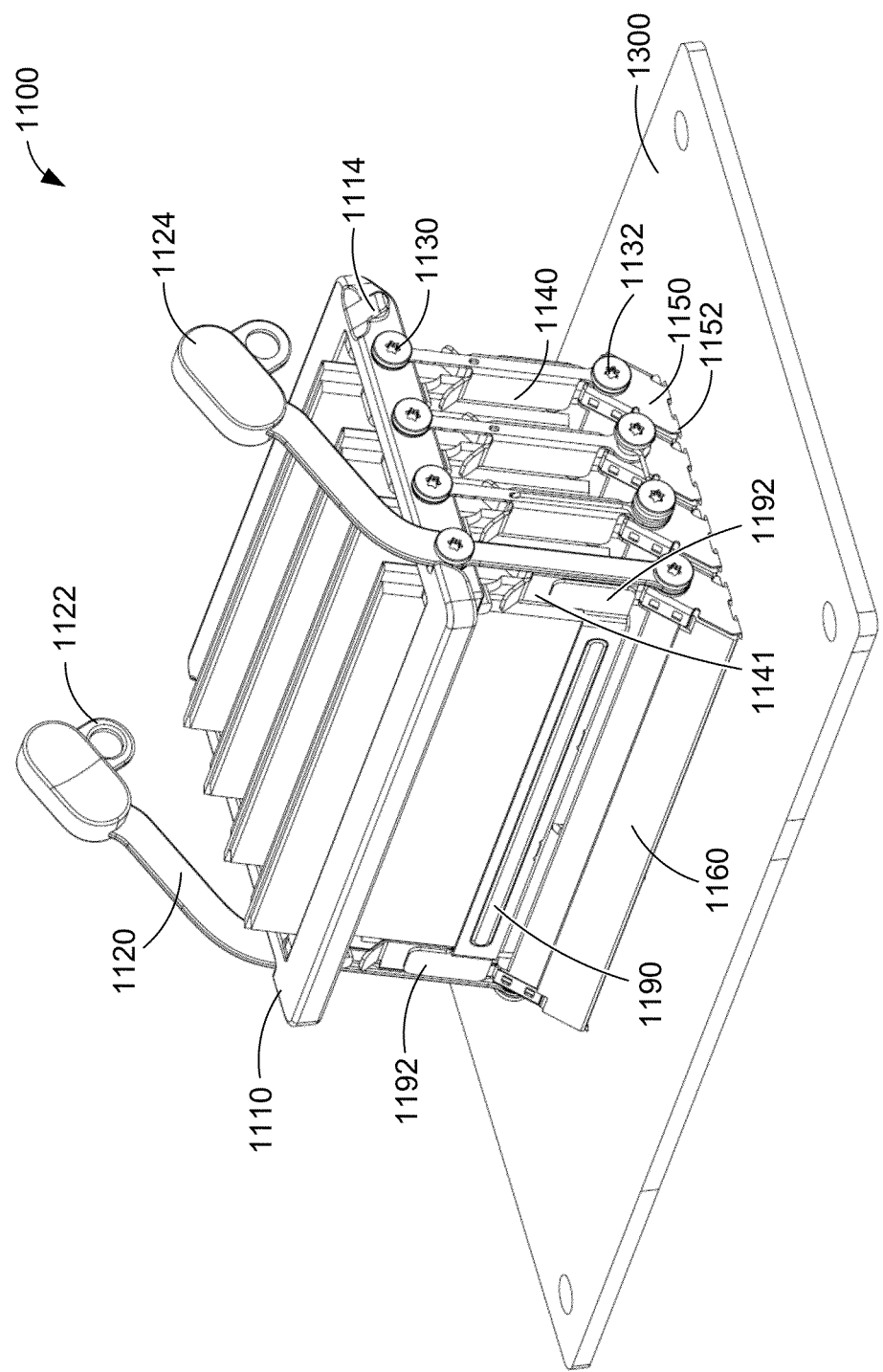
FIG. 23 illustrates a socket according to an embodiment of the present invention.

FIG. 23 illustrates another socket according to another embodiment of the present invention. Socket 1100 may be used to provide electrical connections between one or more cards 1200 and a board 1300. Cards 1200 may be the same or different as cards 200. For example, cards 1200 may be memory cards, graphics cards, networking cards, or other types of cards. In a specific embodiment of the present invention, cards 1200 may be SO-DIMM cards. In this specific embodiment of the present invention, socket 1100 may hold four cards 1200, though in other embodiments of the present invention, socket 100 may hold other numbers of cards.

Socket 1100 may be in one of two states: open and closed. In the open state, as shown, one or more cards 1200 may be removed or inserted by a user. In the open configuration, cards 1200 may be substantially orthogonal to a board. That is, they may be within several tens of degrees within being orthogonal to a board. This angle may assist a user in insertion and extraction of cards 1200.

In various embodiments of the present invention, socket 1100 may provide zero, or near zero, insertion force. In a specific embodiment of the present invention, a small insertion force may be provided by a dimple or other feature arranged to fit in a cutout on card 1200. This low insertion force is removed when a card is fully inserted and the dimple is fit in the cutout on card 1200. This force removal may provide a tactile response to the user to indicate that card 1200 is fully inserted in socket 1100.

Socket 1100 may include one or more levers 1120. Levers 1120 may be used to close socket 1100. Specifically, levers 1120 may be pushed in a downward direction such that loops 1122 on levers 1120 accept tabs 1114 on frame 1100.

In various embodiments of the present invention, different colors, signs, or other indications may be used to show users how to operate socket 1100. For example, thumb tabs 1124 may have a different color that may indicate operation. Arrows or other graphics may be included to show users how to open or close socket 1100. Also, labels or other graphics may be included either on socket 1110 or on a cover or device enclosure.

Again, embodiments of the present invention may provide levers 1120 that provide a pleasant user experience. In this example, levers 1120 may include thumb tabs 1124, which users may use in opening and closing socket 1100. These thumb tabs may be more comfortable for a user to manipulate and may help a user's fingers to avoid slipping off levers 1120 when opening and closing socket 1100.

Levers 1120 may be attached through frame 1110 to guides 1140. In a specific embodiment of the present invention, lever 1120 and guide 1141 may be formed of a single piece, though in other embodiments they may be two pieces. Guides 1140 may be attached between frame 1110 and one or more receptacles 1160. Contacts located in receptacles 1160 may form electrical connections between contacts (not shown) on cards 1200 and a board. Guide 1140 may be connected to frame 1110 and receptacles 1160 by pivot points 1130 and 1132. Covers 1150 may provide mechanical support for a connection between receptacles 1160 and a board using tabs 1152.

Again, cross pieces, or stabilizing bars or portions, may be included to help mechanically stabilize socket 1100, particularly when socket 1100 is open. In this example, stabilizing bars or portions 1190 may join guides 1140 from opposite sides of socket 1100 together. Specifically, stabilizing bars or portions 1190 may have portions 1192 laser or spot-welded or otherwise fixed to guides 1140.

Figure 24:
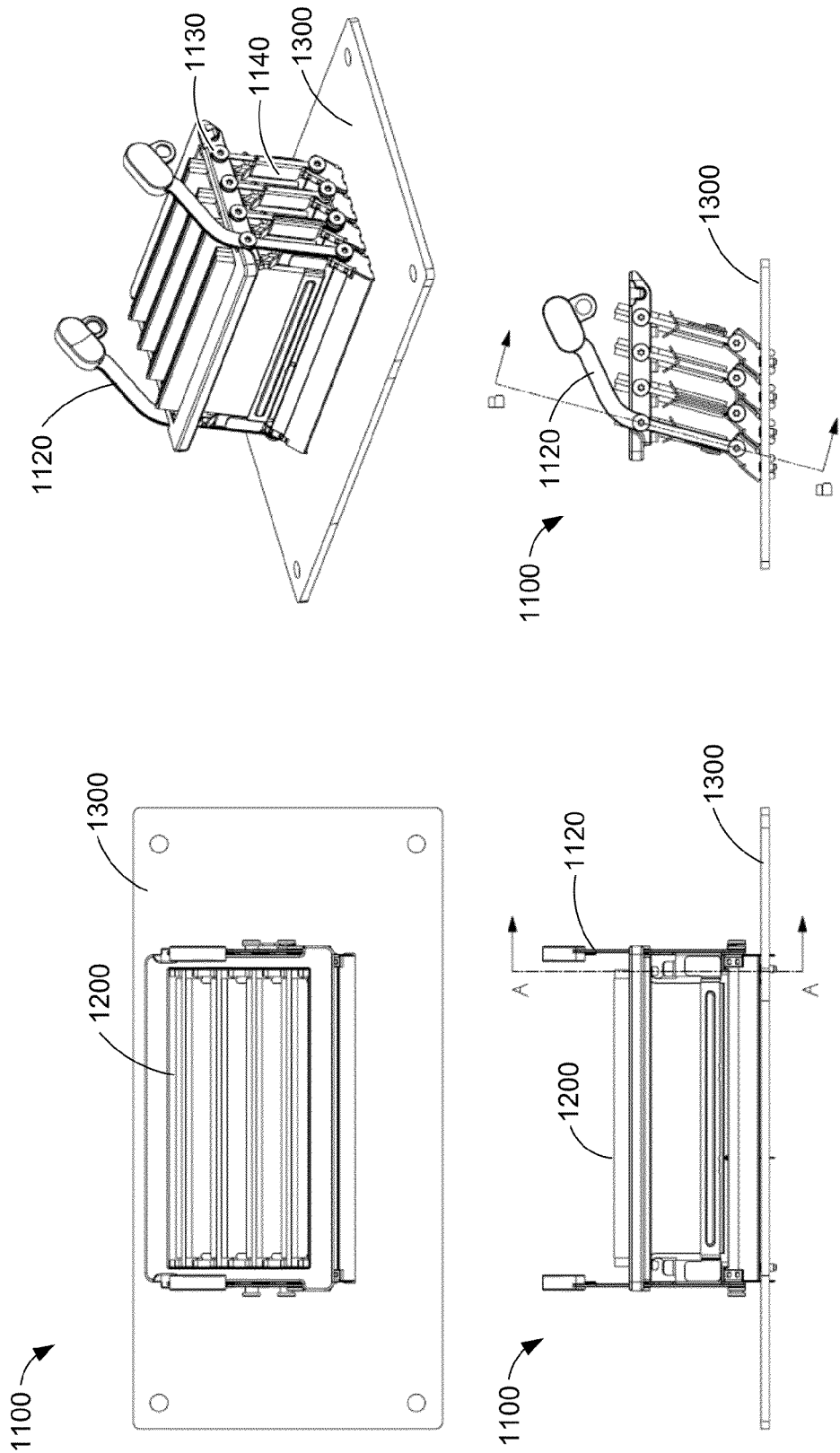
FIG. 24 illustrates top, oblique, front, and side views of a socket according to an embodiment of the present invention.

FIG. 24 illustrates top, oblique, front, and side views of a socket according to an embodiment of the present invention. As can be seen, in an open state, levers 1120 are up away from frame 1110, and cards 1200 are substantially orthogonal to board 1300. Board 1300 may be a main logic board, or other type of a printed circuit board. In this and the following examples, only a portion of main logic board 1300 is shown. In this specific example, when socket 1100 is the open state, cards 1200 are approximately 10 degrees away from being orthogonal to board 1300.

Figure 25:
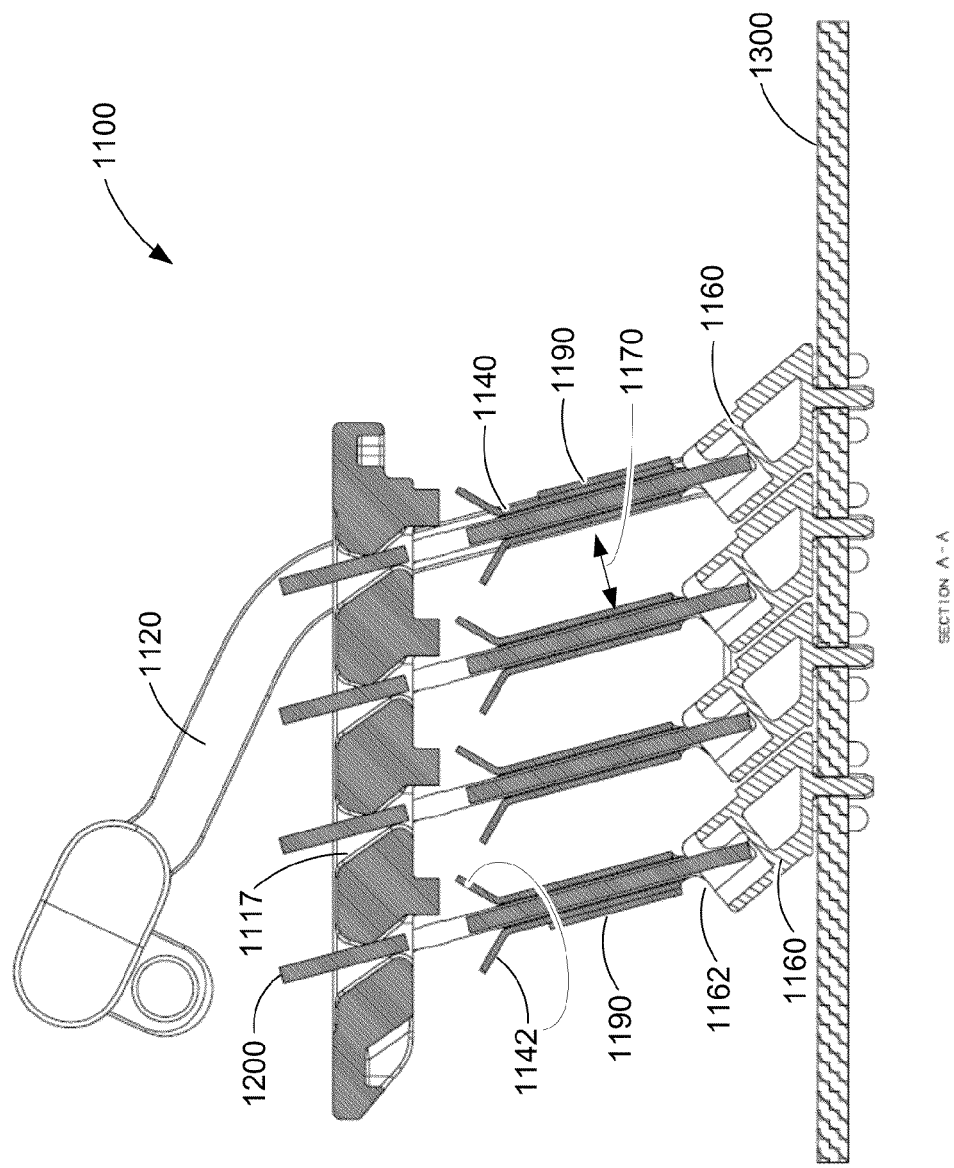
FIG. 25 illustrates a cut-away side view of a socket according to an embodiment of the present invention.

FIG. 25 illustrates a cut-away side view of a socket according to an embodiment of the present invention. In this example, cards 1200 may be held by guides 1140 and are inserted into receptacles 1160 through openings 1162. Frame 1100 may include guides or lead-in features 1117 and guides 1140 may include a funnel shaped top 1142 for assisting a user and inserting card 1200 into receptacle 1100. Guides or lead-in 1117 features may be sized narrowly enough to assist a user in inserting cards 1200 into correct receptacles 1160, but wide enough to allow insertion of cards 1200.

It should also be noted that guides 1140 may be relatively narrow, such that opening 1170 may be relatively large. This large opening may aid in airflow and therefore may improve the removal of heat from circuits on cards 1200. Stabilizing bars or portions 1190 may be included on the front and back of socket 1100 on the outermost guides 1140. In other embodiments of the present invention, stabilizing bars or portions 1190 may be included on these or other guides 1140.

Figure 26:
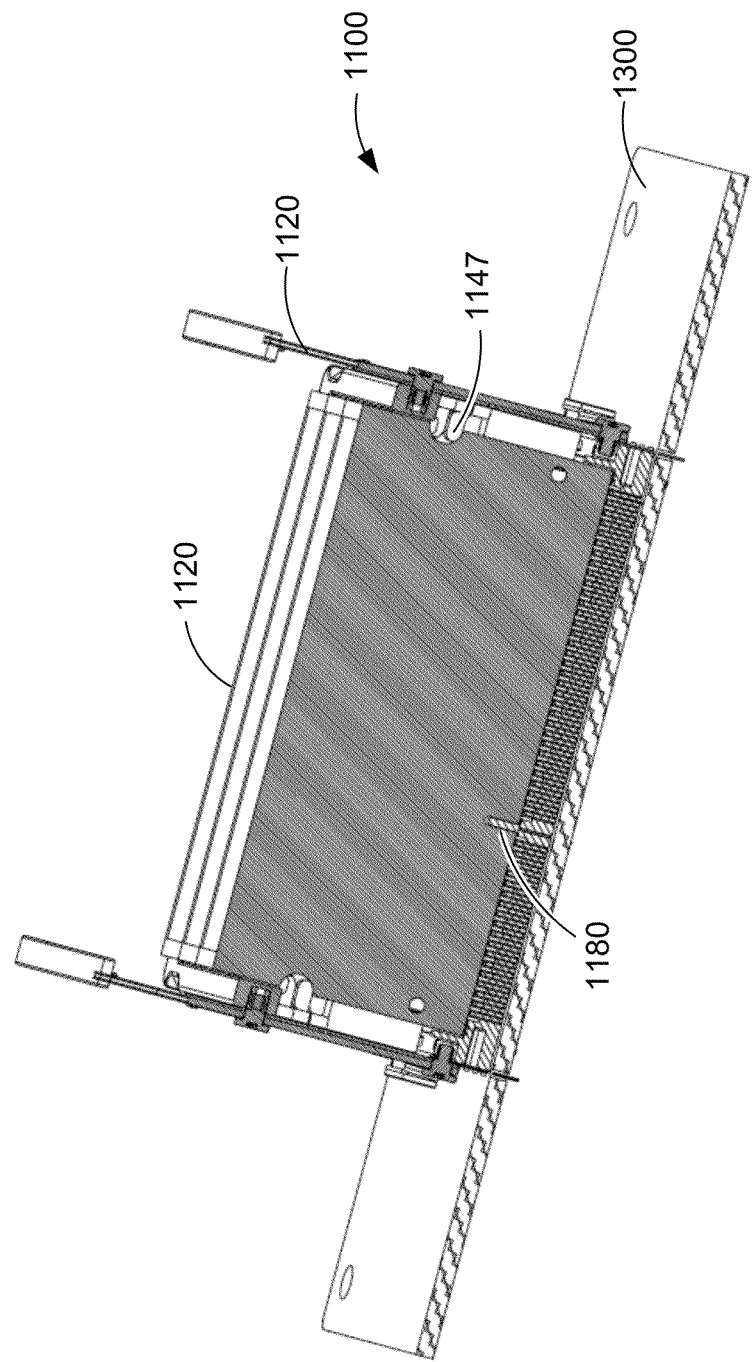
FIG. 26 illustrates a front cut-away view of a socket according to an embodiment of the present invention.

FIG. 26 illustrates a front cut-away view of a socket according to an embodiment of the present invention. This figure illustrates keying feature 1180, which may be used to prevent an upside down insertion of card 1200.

It may be desirable that when a card 1200 is inserted into socket 1100, that card 1200 is not easily removed. It may also be desirable that socket 1100 not be able to close when a card 1200 is improperly inserted. To provide these conditions, embodiments of the present invention may user features on guides 1140, such as dimples 144 above, or cleats 1147, as in this example.

When card 1120 is properly inserted in socket 1100, cleats 1147 may fit in cutout portions on cards 1200. The cleats may then hold cards 1200 in place when socket 1100 is closed. When card 1200 is improperly inserted in socket 1100, cleats 1147 are against a portion of card 1200, not the cutout in the card. This may prevent socket 1100 from closing properly, which may alert a user that one or more cards 1200 needs to be properly seated in 1100. Cleats 1147 may be out of the path of card 1200 when socket 1100 is in the open position, in which case it provides little or no resistance to card 1200 during insertion. Again, cleats 1147 may the lock in cutouts on cards 1200 when socket 1100 is locked.

Figure 27:
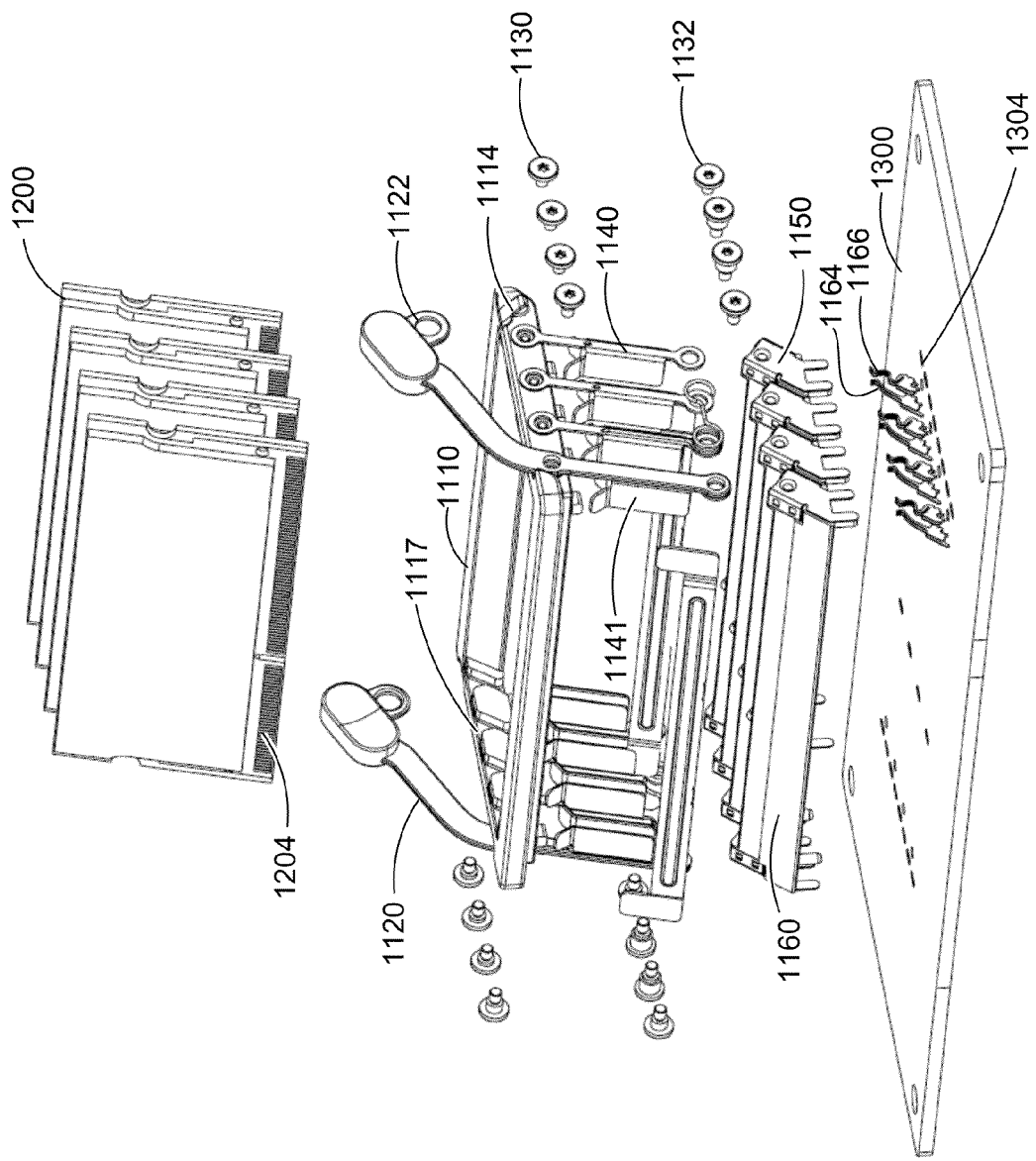
FIG. 27 illustrates an exploded view of a socket according to an embodiment of the present invention.

FIG. 27 illustrates an exploded view of a socket according to an embodiment of the present invention. In this figure, socket 1100 is in an open state. This figure also includes cards 1200 and board 1300. Again, guides 1140 may attach to frame 1110 at a first end and receptacles 1160 at a second end. In a specific embodiment of the present invention, lever 1120 and guide 1141 may be one piece, though in other embodiments of the present invention, they may be formed using two individual pieces. Guides 1140 may pivot relative to frame 1110 and receptacles 1150 at pivot points 1130 and 1132. Receptacles 1160 may include covers 1150 and contacts 1164 and 1166. Contacts 1164 and 1166 may form electrical connections between contacts 1204 on cards 1200 and contacts 1304 on board 1300.

Again, when a user inserts cards 1200 into socket 1100, it may be desirable to ensure that card 1200 is inserted into the correct receptacle 1160. Again, to increase the likelihood of a correct insertion, insertion guides or lead-in features 1117 may be narrowed to the point where an incorrect insertion is unlikely.

Again, socket 1100 may be closed by pushing down on levers 1120. The downward motion of levers 1140 may cause guide 1141, to which is attached, to rotate clockwise as shown in the figure. This, in turn, may cause frame 1110 to move forward and down, which may cause the other guides 1140 to similarly rotate in a clockwise fashion. Loops 1122 on levers 1120 may accept tabs 1114. Levers 1120 may be biased inward such that tabs 1114 may stay in loops 1122 when socket 1100 is in the closed position. Examples of a socket in the closed position are shown in the following figures.

Figure 28:
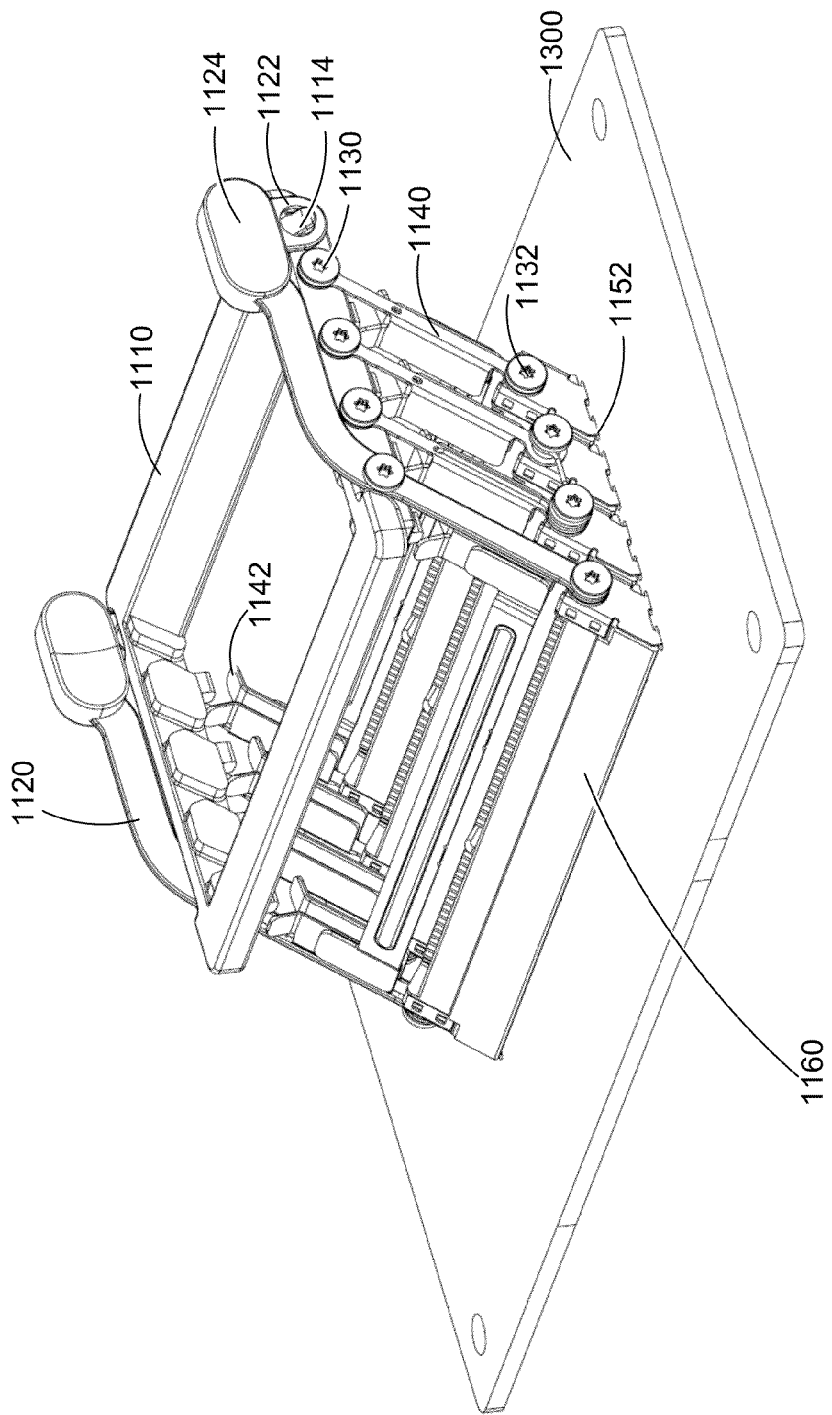
FIG. 28 illustrates a socket in a closed position according to an embodiment of the present invention.

FIG. 28 illustrates a socket in a closed position according to an embodiment of the present invention. Again, loops 1122 on levers 1120 accept tabs 1114. Guide 1140 may attach between frame 1110 and receptacles 1160 at pivot points 1130 and 1132. Guides 1140 may further include a funnel-shaped top 1142. Receptacle covers 1150 may provide mechanical support between receptacles 1160 and a board via tabs 1152.

Figure 29:
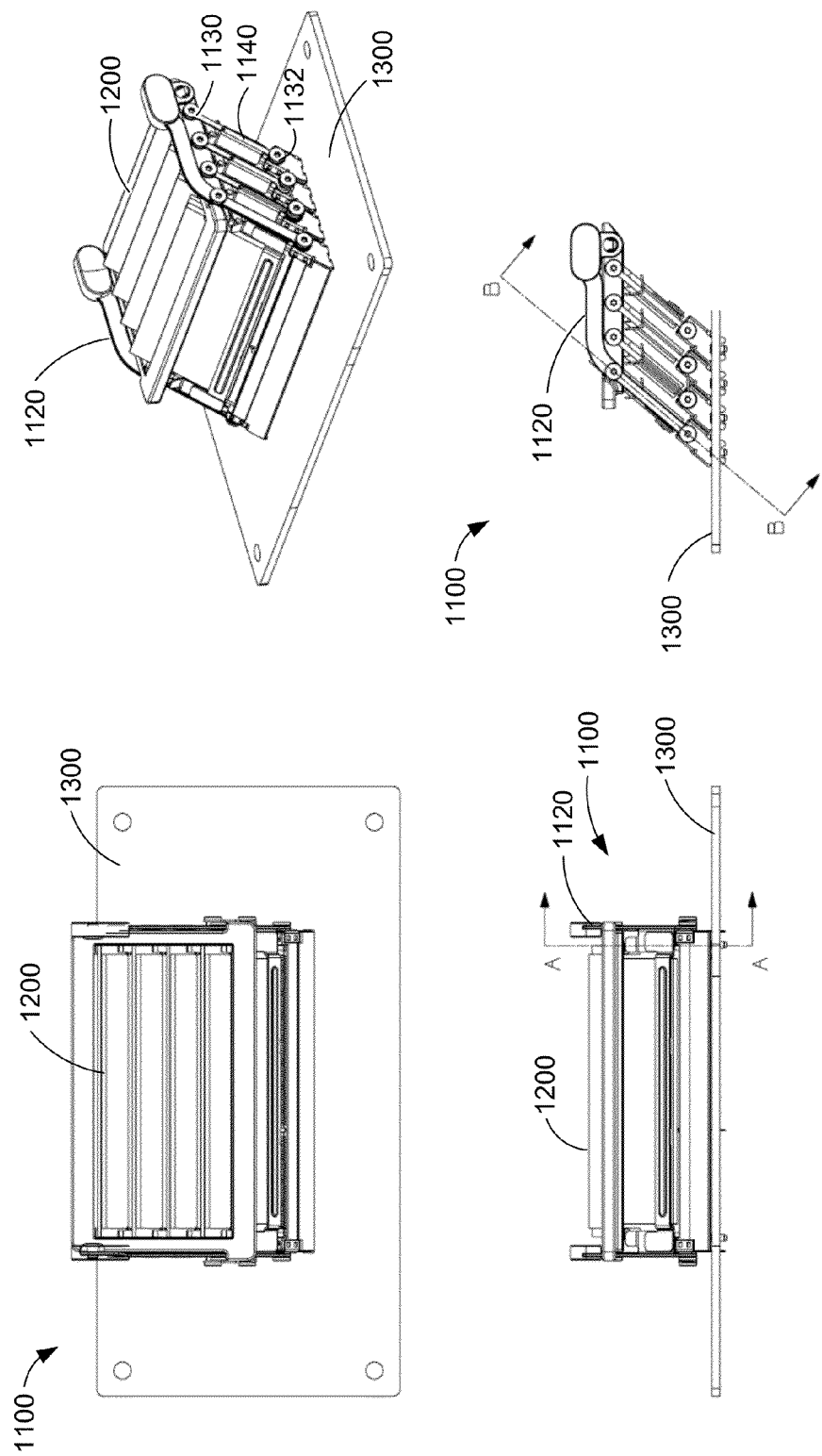
FIG. 29 illustrates top, oblique, front, and side views of a socket in a closed state according to an embodiment of the present invention.

FIG. 29 illustrates top, oblique, front, and side views of a socket in a closed state according to an embodiment of the present invention. As can be seen, when socket 1100 is closed, cards 1200 move substantially in a direction towards being in parallel with board 1300. In this example, cards 1200 move to approximately a 45 degree angle to board 1300, though in other embodiments of the present invention, cards 1200 may be within several tens of degrees of a 45 degree angle to board 1300.

Figure 30:
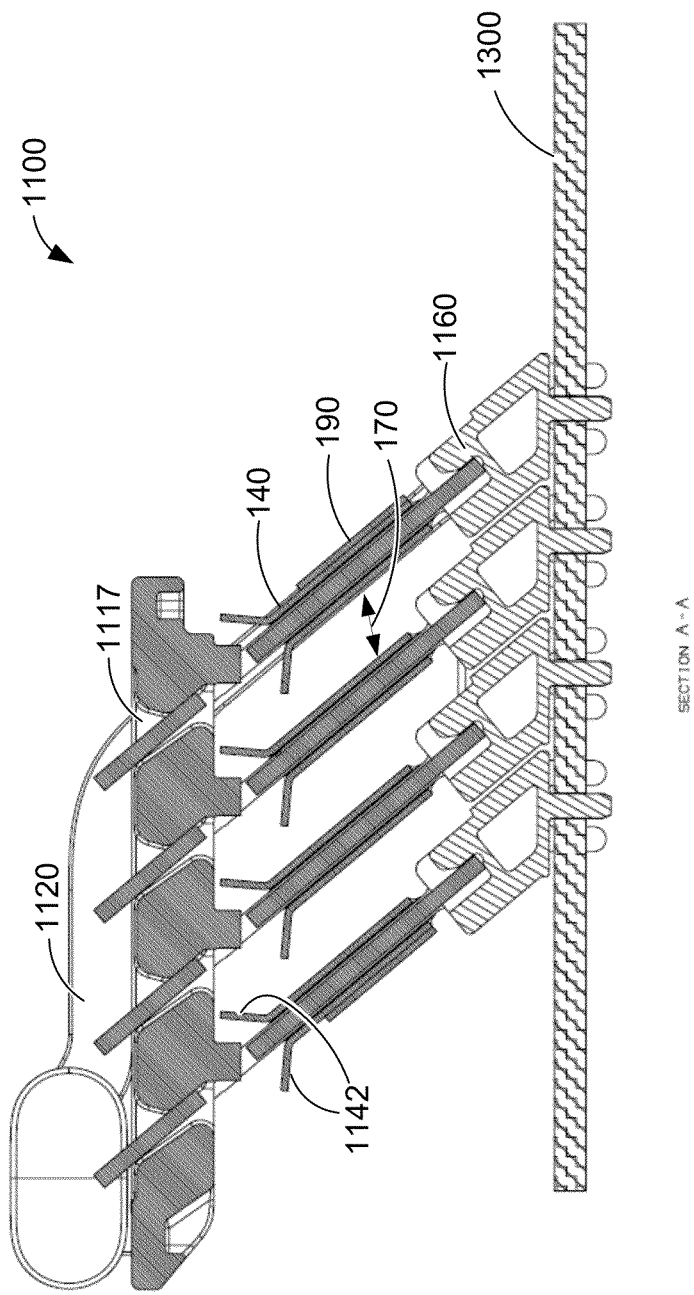
FIG. 30 illustrates a cut-away side view of a socket according to an embodiment of the present invention.

FIG. 30 illustrates a cut-away side view of a socket according to an embodiment of the present invention. Again, frame 1110 may include guides or lead-ins 1117 and guides 1140 may include a funnel-shaped top 1142. Spacing 1170 may be relatively large to improve airflow and heat removal from circuitry on cards 1200.

Figure 31:
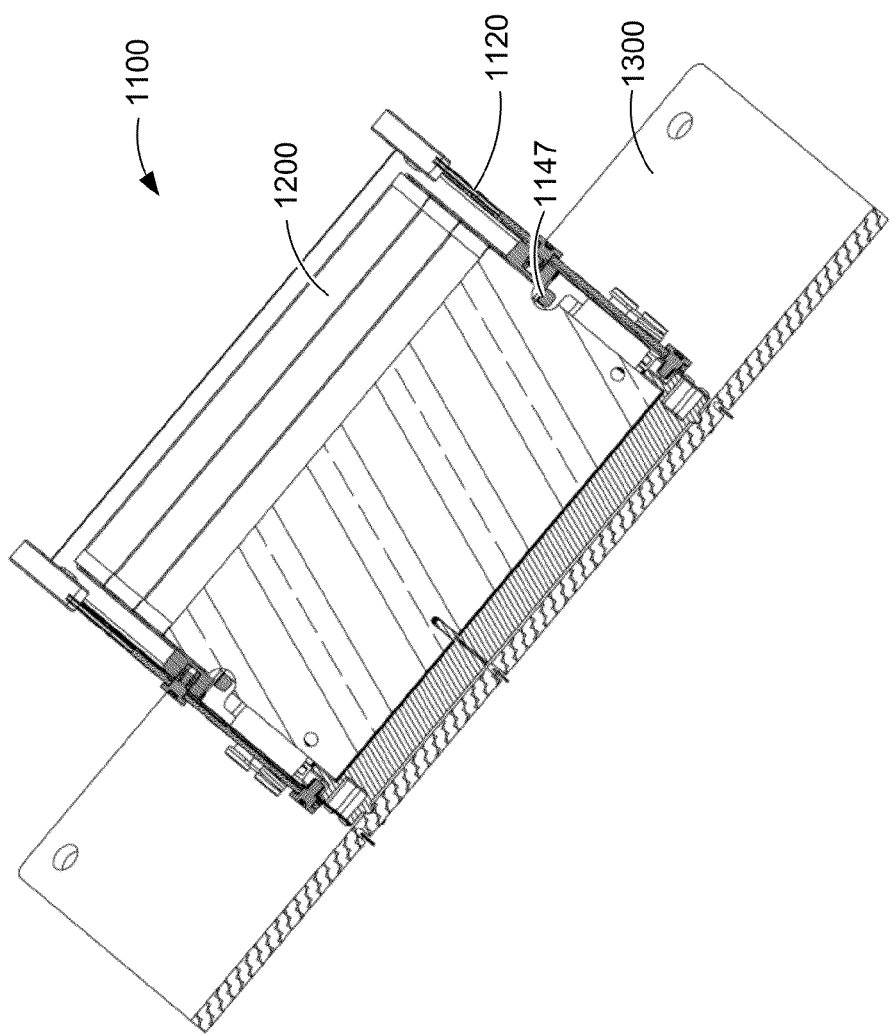
FIG. 31 illustrates a cut-away front view of a socket in a closed position according to an embodiment of the present invention.

FIG. 31 illustrates a cut-away front view of a socket in a closed position according to an embodiment of the present invention.

Figure 32:
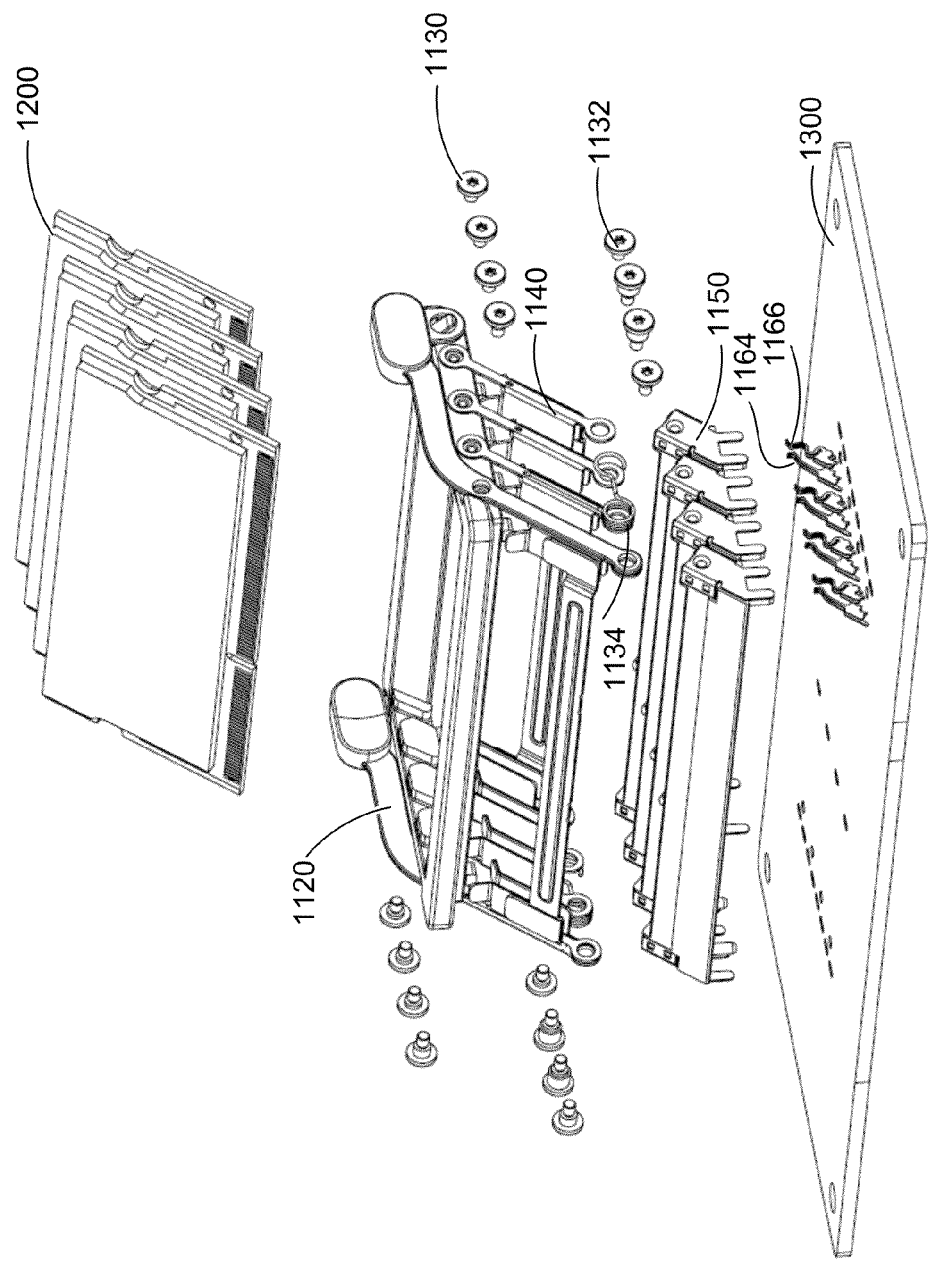
FIG. 32 illustrates an exploded view of a socket in a closed position according to an embodiment of the present invention.

FIG. 32 illustrates an exploded view of a socket 1100 in a closed position according to an embodiment of the present invention. Again, one or more elements, such as springs or torsion springs, may be included to maintain the switch in an open position unless the switch is positively closed. In this example, torsion spring 1134 may be used to maintain the switch in an open position unless the switch is positively closed. The presence of this spring may also help to avoid vibrations in socket 1100 in both the open and closed states.

Sockets according to an embodiment of the present invention may be considered to have three main portions. A first portion may include frame 1110 and levers 1120. The relative position of frame 1110 and levers 1120 dictates whether the socket is an open or closed position. The second portion may be considered to be guides 1140, which connect frame 1110 to receptacles 1160. As described above, guides 1140 may include funnel top 1142. The third portion, receptacles 1160, include openings for accepting ends of cards 1200. They also may include contacts to form electrical connections between contacts on cards 1200 and board 1300. Receptacles according to embodiments of the present invention are shown in the following figures.

Figure 33:
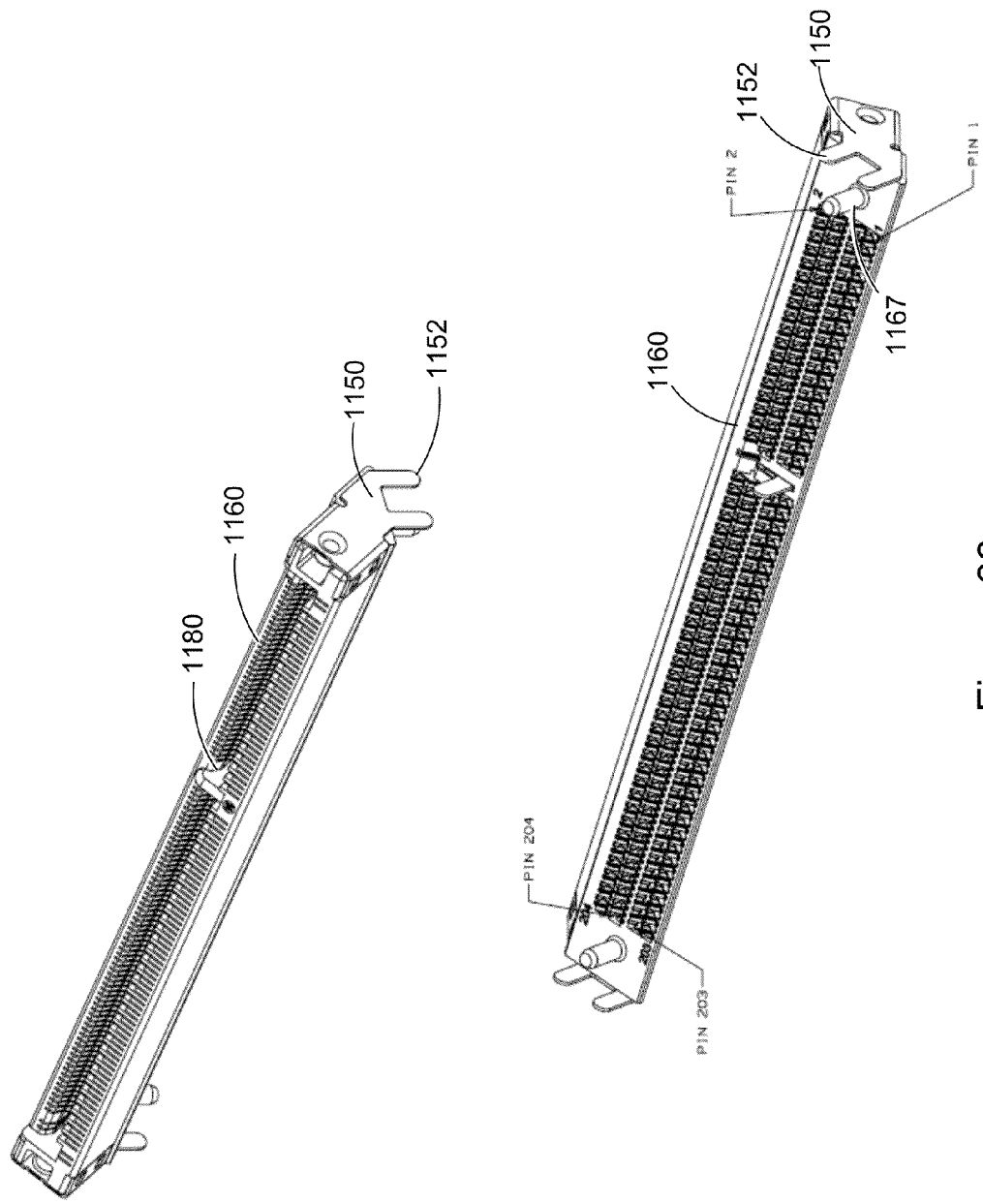
FIG. 33 illustrates a receptacle according to an embodiment of the present invention.

FIG. 33 illustrates a receptacle according to an embodiment of the present invention. In this example, receptacle 1160 may include keying feature 1180 and covers 1150. Covers 1150 may further include tabs that may be soldered into a board for mechanical support. Receptacle 1160 may further include tabs 1167 that may be inserted into a board for further mechanical support.

Figure 34:
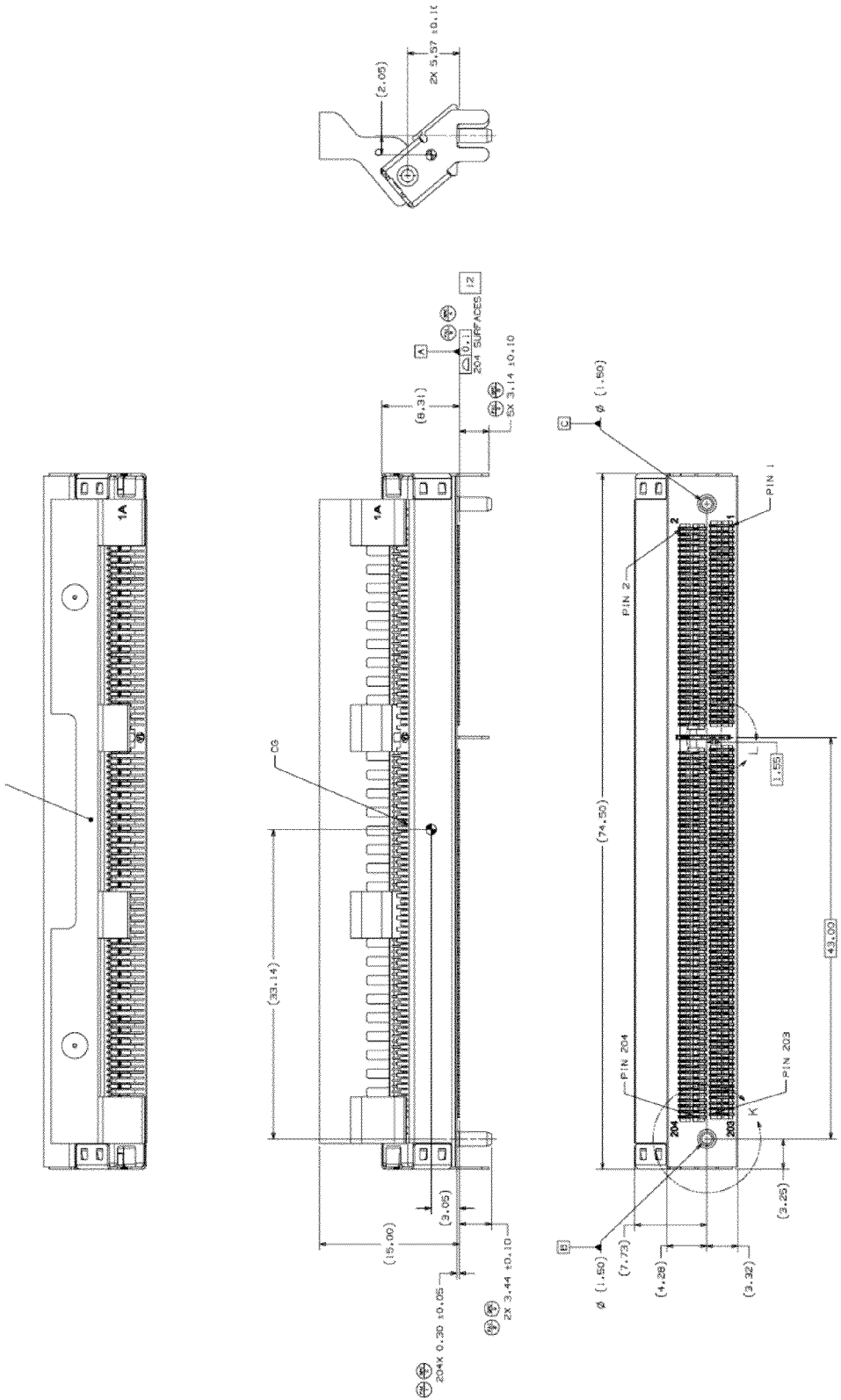
FIGS. 34 and 35 are mechanical diagrams of a receptacle according to an embodiment of the present invention.
Figure 35:
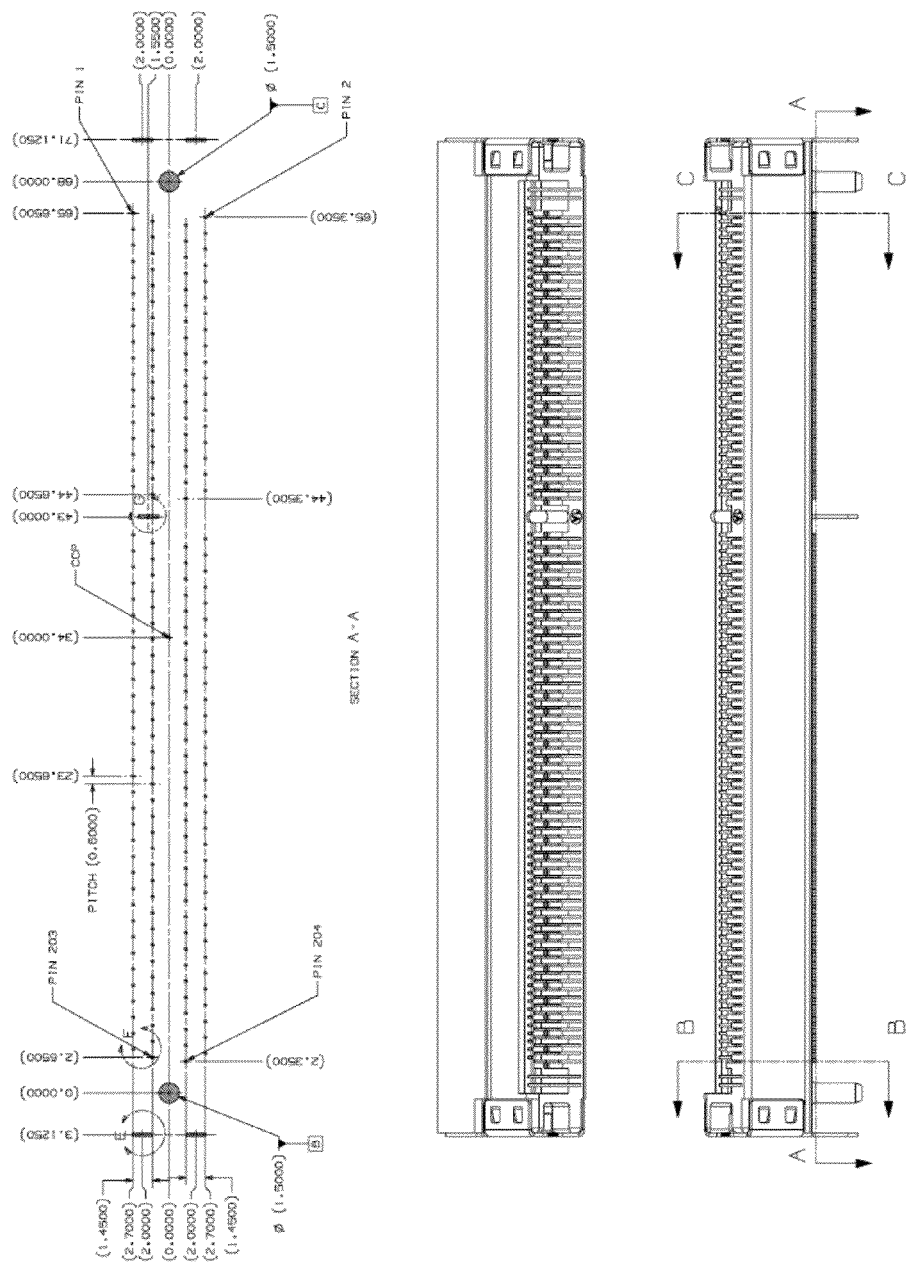

FIGS. 34 and 35 are mechanical diagrams of a receptacle according to an embodiment of the present invention.

Figure 36:
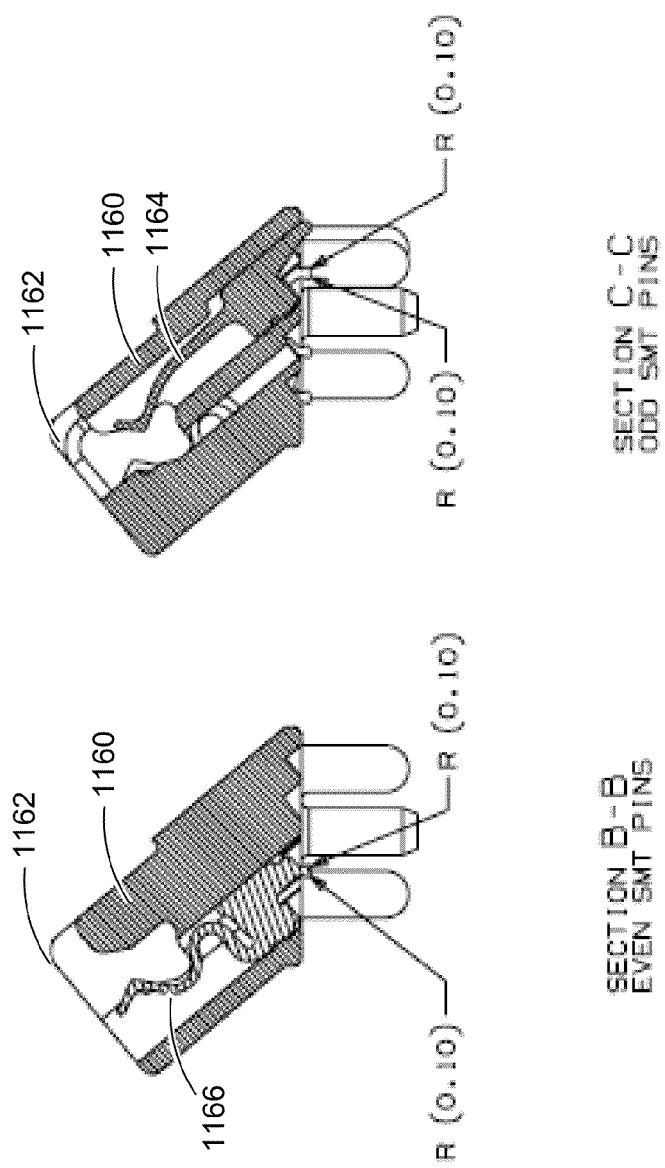
FIG. 36 illustrates cut-away views of a receptacle according to an embodiment of the present invention.

FIG. 36 illustrates cut-away views of a receptacle according to an embodiment of the present invention. These cut-away views show contacts 1164 and 1166. Contacts 1164 and 1166 may form electrical connections between contacts on cards 1200 and contacts on a main logic board 1300.

Figure 37:
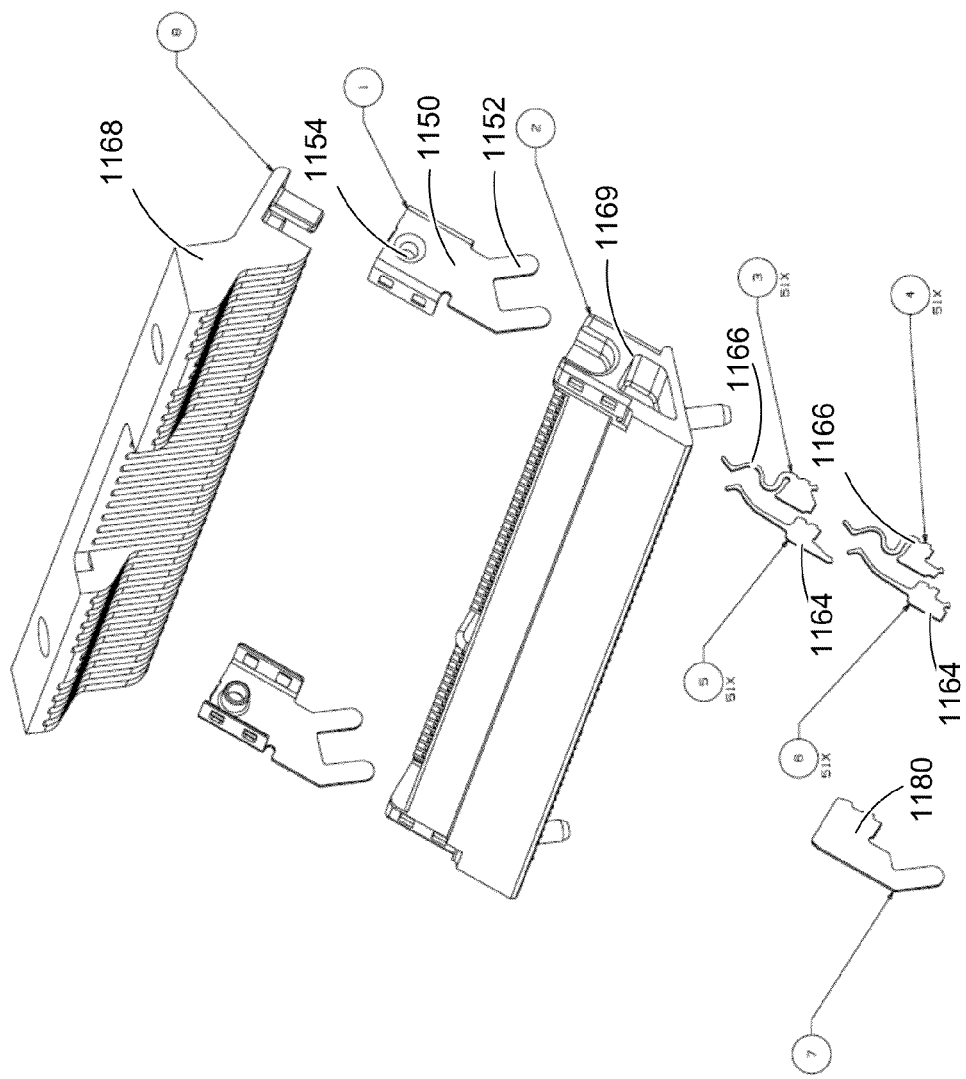
FIG. 37 illustrates an exploded view of a receptacle according to an embodiment of the present invention.

FIG. 37 illustrates an exploded view of a receptacle according to an embodiment of the present invention. Receptacle 1160 includes housings 1168 and 1169, two versions each of contacts 1164 and 1166, tab 1182, and covers 1150. Covers 1150 may include openings 1154 for pivot points, and tabs 1152, which may be soldered into a board for mechanical support.

Figure 38:
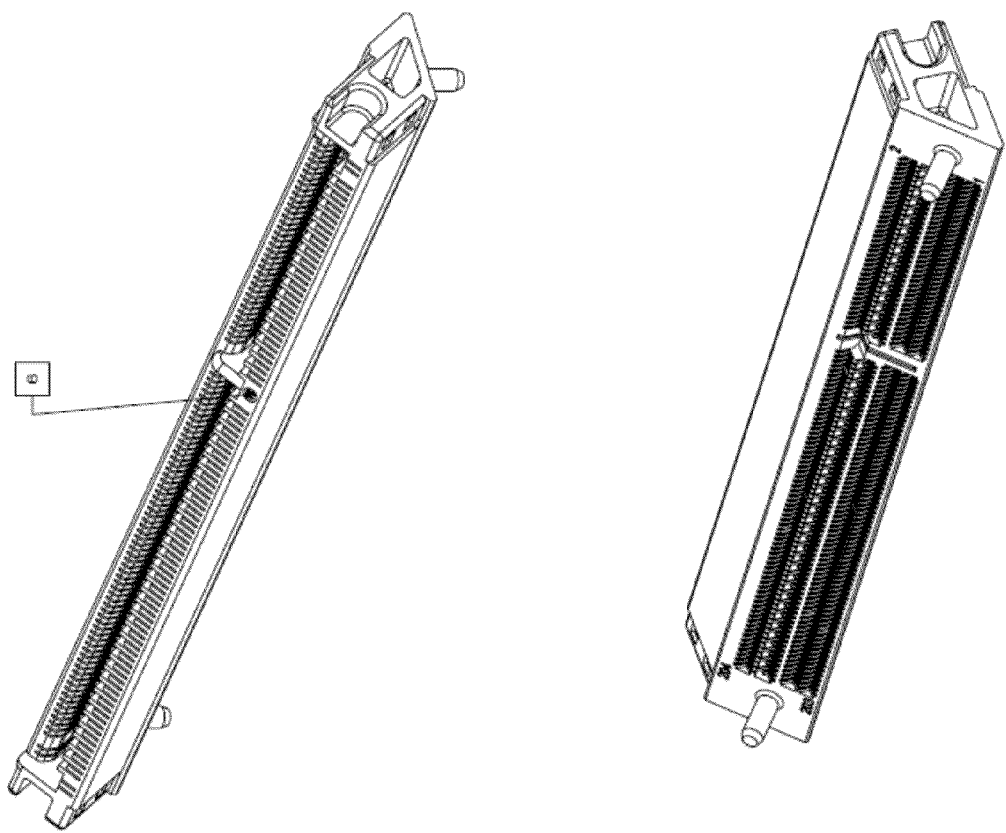
FIG. 38 illustrates a housing for a receptacle according to an embodiment of the present invention.

FIG. 38 illustrates a housing for a receptacle according to an embodiment of the present invention.

Figure 39:
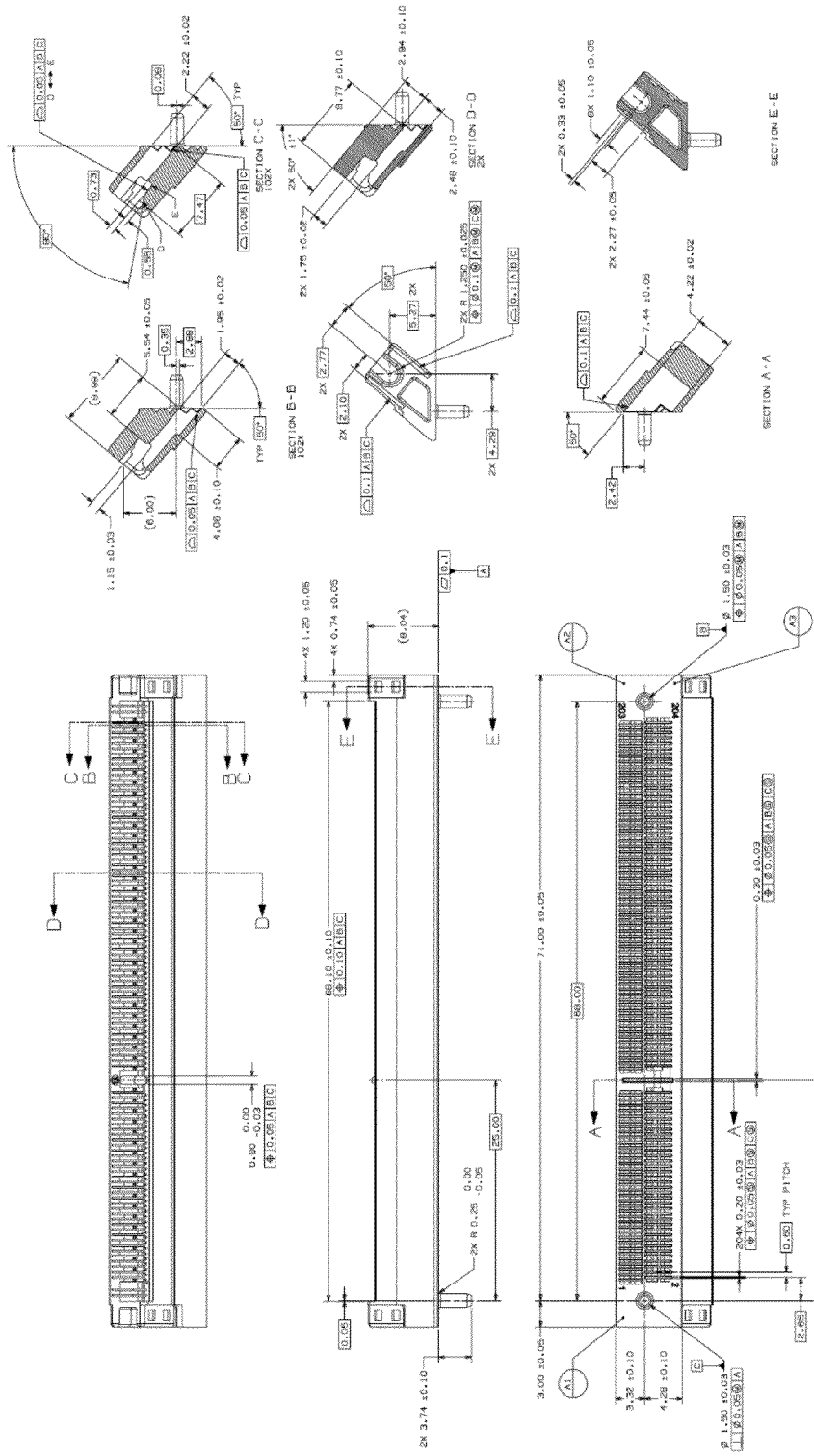
FIGS. 39 and 40 illustrate mechanical diagrams of a housing for a receptacle according to an embodiment of the present invention.
Figure 40:
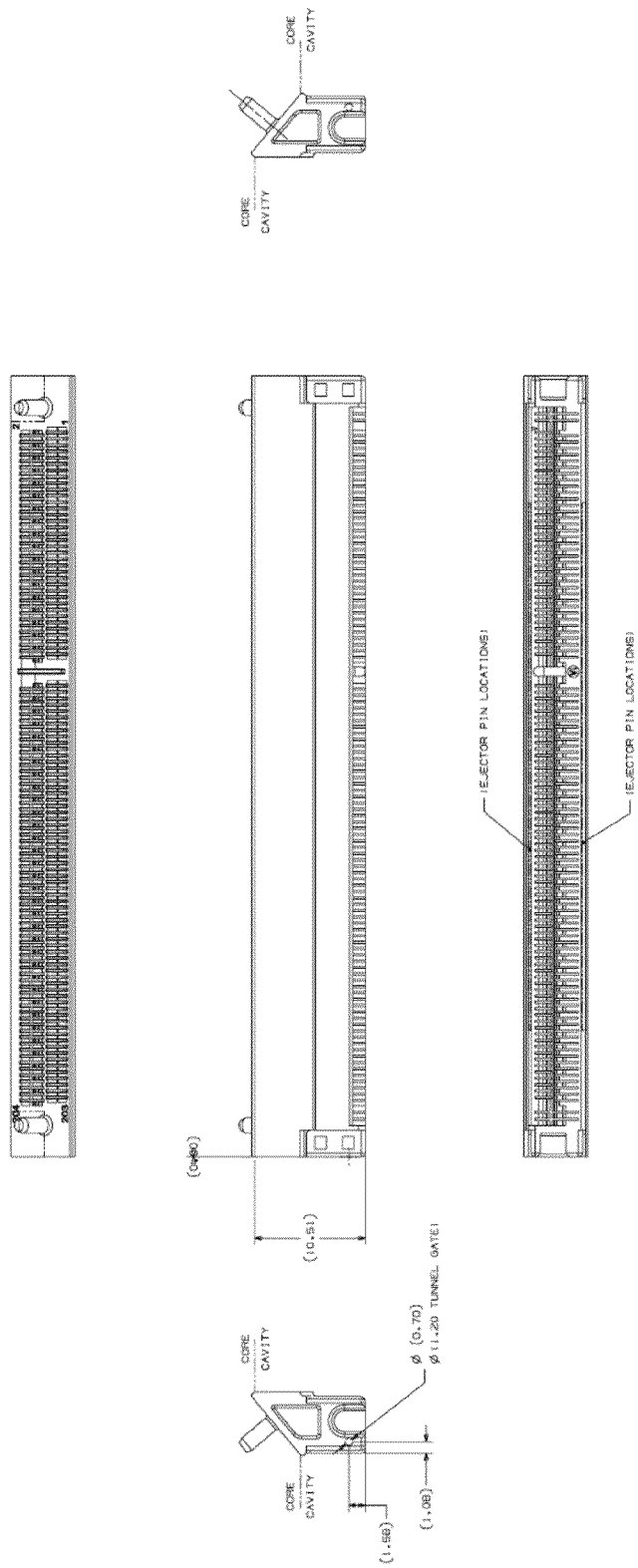

FIGS. 39 and 40 illustrate mechanical diagrams of a housing for a receptacle according to an embodiment of the present invention.

Figure 41:
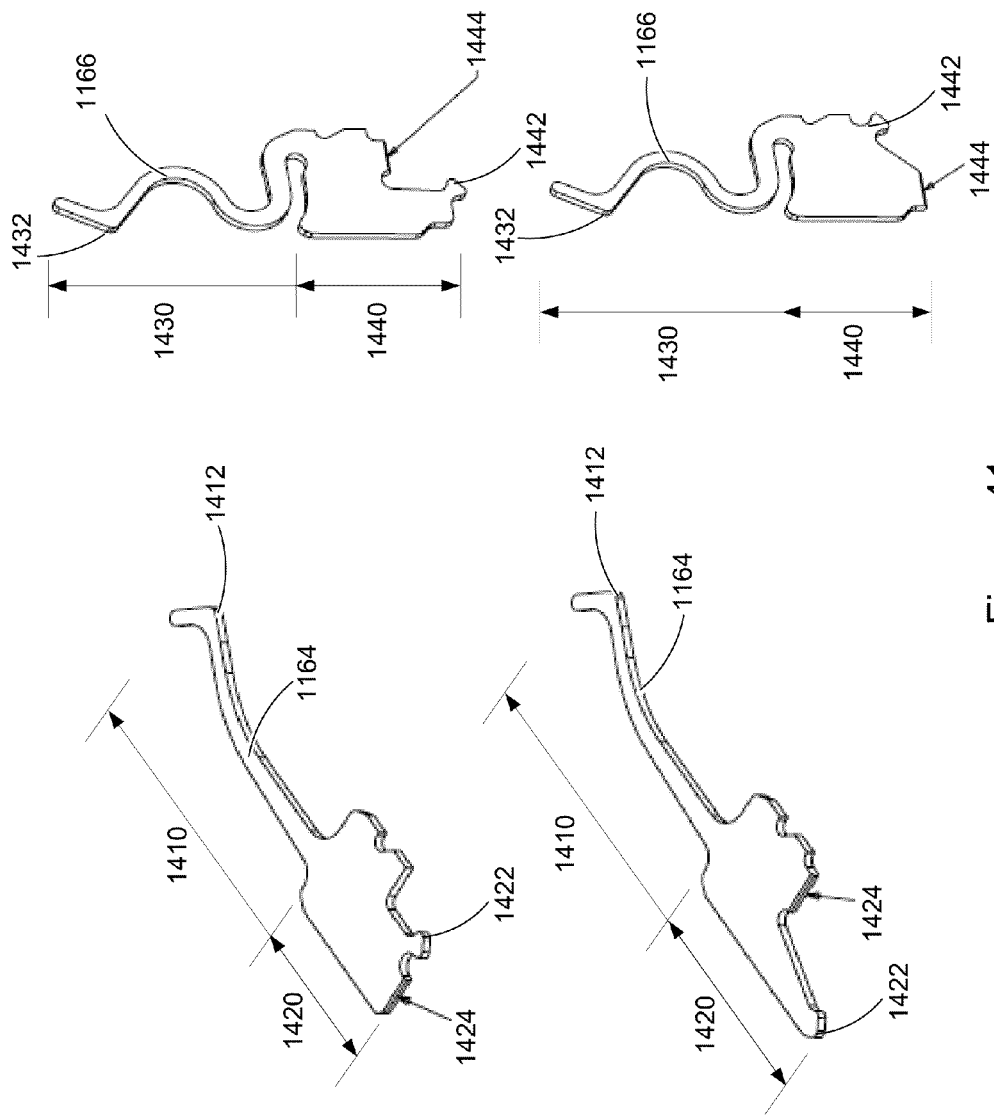
FIG. 41 illustrates contacts that may be used in a receptacle and a socket according to an embodiment of the present invention.

FIG. 41 illustrates contacts that may be used in a receptacle and a socket according to an embodiment of the present invention. Two versions of each of contacts 1164 and 1166 are shown, though in other embodiments of the present invention, other types of contacts may be included. Contacts 1164 may include a serpentine portion 1410. Serpentine portion 1410 may include contact portion 1412 to make an electrical connection with a contact on a card, such as card 200. Contact 1164 may further include base portion 1420. Much of base portion 1420 may be substantially encased in a housing of the receptacle. Base portion may include edge 1424. Edge 1424 may be a location where a carrier that may be used to handle contact 1164 during plating and installation is attached. When contact 1164 is placed in a receptacle, the carrier may be broken away or otherwise detached. Contact 1164 may also include board contact 1422 to form an electrical connection with a contact on a board, such as board 300 or 1300. Board contact 1422 may form a point contact to a contact on the board. During reflow (when the contact may be soldered to a board), solder may wick in an upward direction around contact 1422 to form a connection and strong solder joint or column.

Similarly, contact 1166 may include a serpentine portion 1430. Serpentine portion 1430 may include contact portion 1432 to form an electrical connection with a contact on a card. Contact 1166 may further include base portion 1440. Much of base portion 1440 may be substantially encased in a housing of the receptacle. Base portion may include edge 1444. Edge 1444 may be a location where a carrier that may be used to handle contact 1166 during plating and installation is attached. When contact 1166 is placed in a receptacle, the carrier may be broken away or otherwise detached. Contact 1166 may also include board contact 1442 to form an electrical connection with a contact on a board. Board contact 1442 may form a point contact to a contact on the board. During reflow, solder may wick in an upward direction around contact 1442 to form a connection and strong solder joint or column.

Serpentine portions 1410 and 1430 may be arranged to provide necessary flexibility such that a good electrical connection is maintained with contacts on card 1200. These serpentine shapes may also allow this flexibility and connection to be achieved in a small area. This smaller size may further improve signal quality and may allow socket 1100 to handle high-speed signals.

Figure 42:
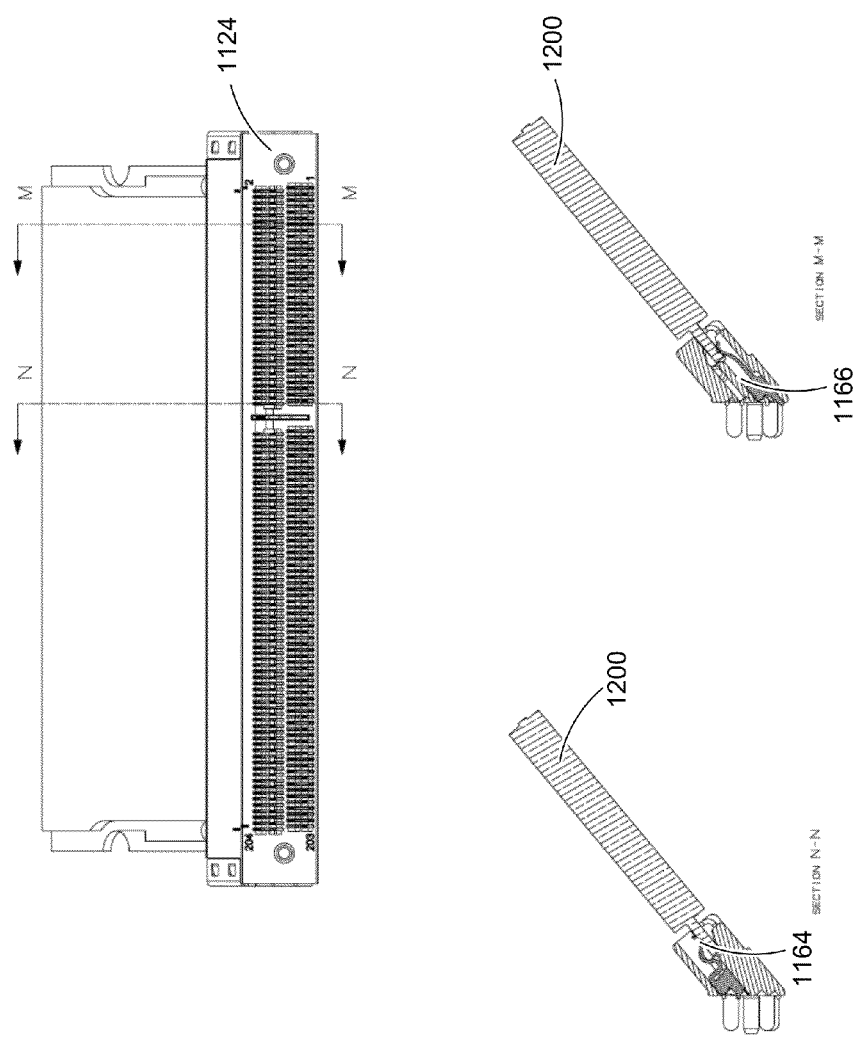
FIG. 42 illustrates cut-away views of a receptacle when a card is inserted in a closed position.

FIG. 42 illustrates cut-away views of receptacle 1161 when card 1200 is inserted in a closed position. As can be seen, contacts 1164 and 1166 may be deformed such that they may provide good electrical connections with contacts on card 1200.

Figure 43:
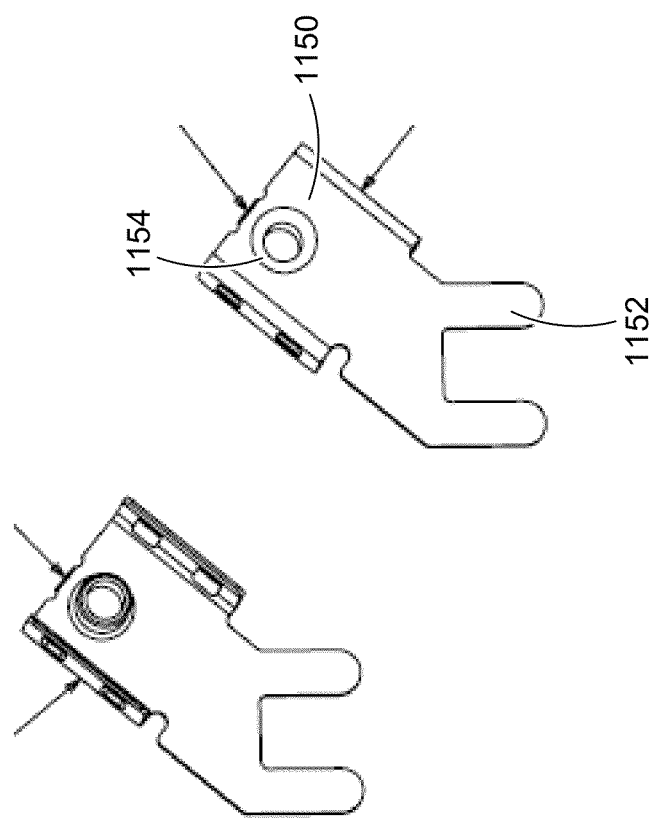
FIG. 43 illustrates receptacle covers according to an embodiment of the present invention.

FIG. 43 illustrates receptacle covers according to an embodiment of the present invention. Receptacle covers 1150 may include tabs 1152 and openings 1154. Tabs may be inserted and soldered in board 1300 to provide mechanical stability. Openings 1154 may accept pivot points 1130 and 1132.

Figure 44:
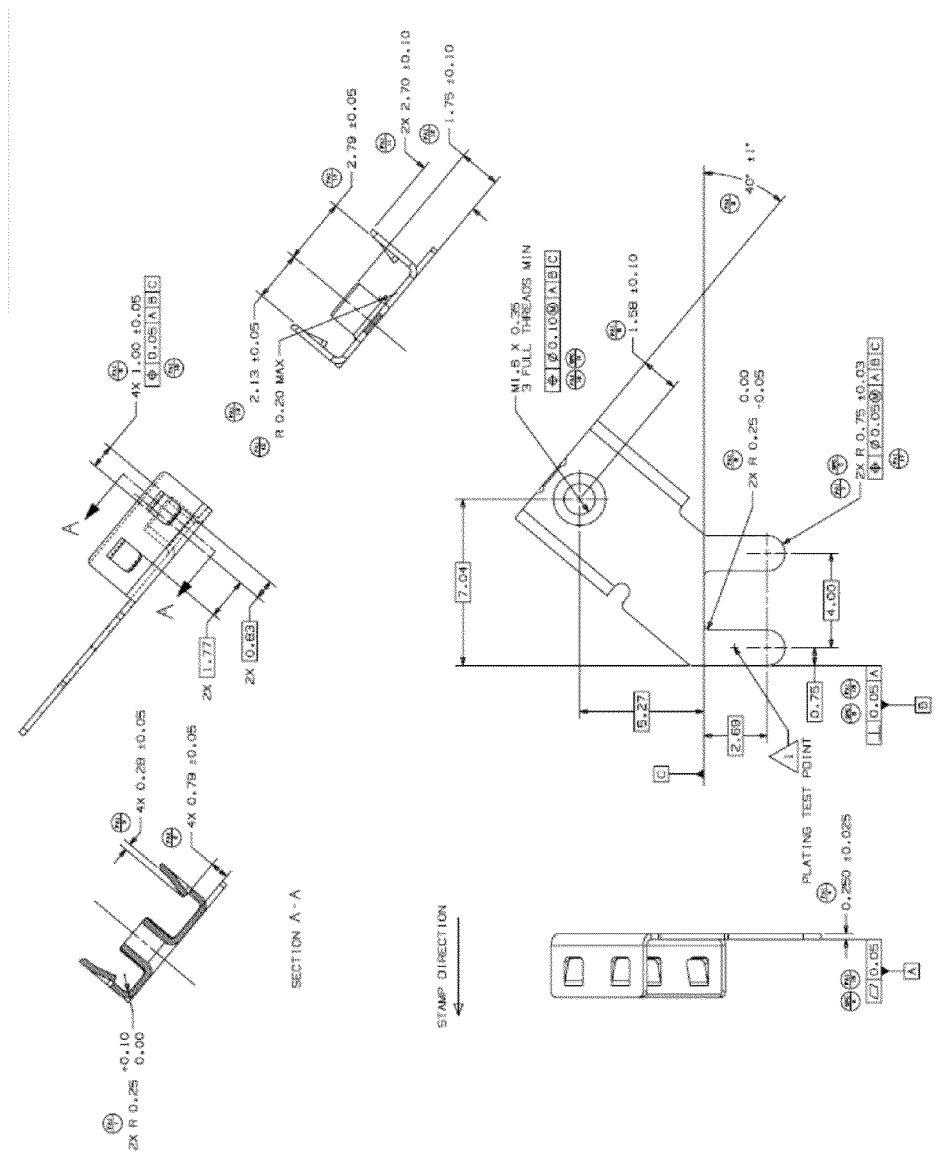
FIG. 44 is a mechanical diagram of a receptacle cover according to an embodiment of the present invention.

FIG. 44 is a mechanical diagram of a receptacle cover according to an embodiment of the present invention.

Again, in various embodiments of the present invention, different colors, signs, or other indications may be used to show users how to operate socket 1100. For example, thumb tabs 1124 may have a different color that may indicate operation. Arrows or other graphics may be included to show users how to open or close socket 1100. Also, labels or other graphics may be included either on socket 1110 or on a cover or device enclosure. One example is shown in the following figure.

Figure 45:
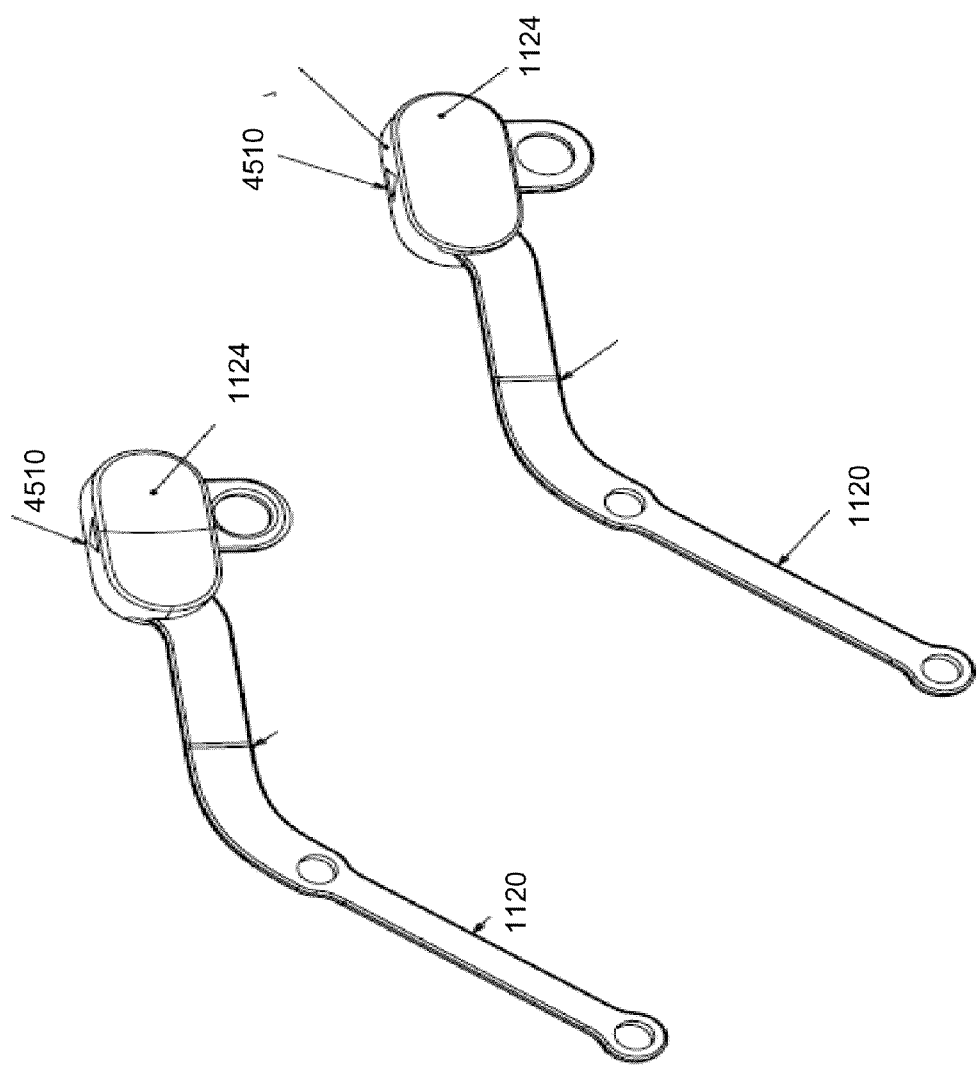
FIG. 45 illustrates levers including instructional symbols according to an embodiment of the present invention.

FIG. 45 illustrates levers including instructional symbols according to an embodiment of the present invention. As shown, levers 1120 may include thumb tabs 1124. Thumb tabs 1124 may include instructional graphics or symbols 4510. In this example, instructional graphics or symbols 4510 may be outwardly pointed arrows that may be attached to, molded into, formed as part of, painted on, or otherwise placed on or formed on thumb tabs 1124. While these instructional graphics or symbols 4510 or shown as being on levers 1120, levers 120 or other levers used in embodiments of the present invention may also include instructional graphics or symbols 4510 or other instructional graphics or symbols.

Again, one or more elements, such as springs or torsion springs, may be included to maintain the switch in an open position unless the switch is positively closed. The presence of this spring may also help to avoid vibrations in socket 1100 in both the open and closed states. In some embodiments of the present invention, additional spring force may need to be provided. An example is shown in the following figure.

Figure 46:
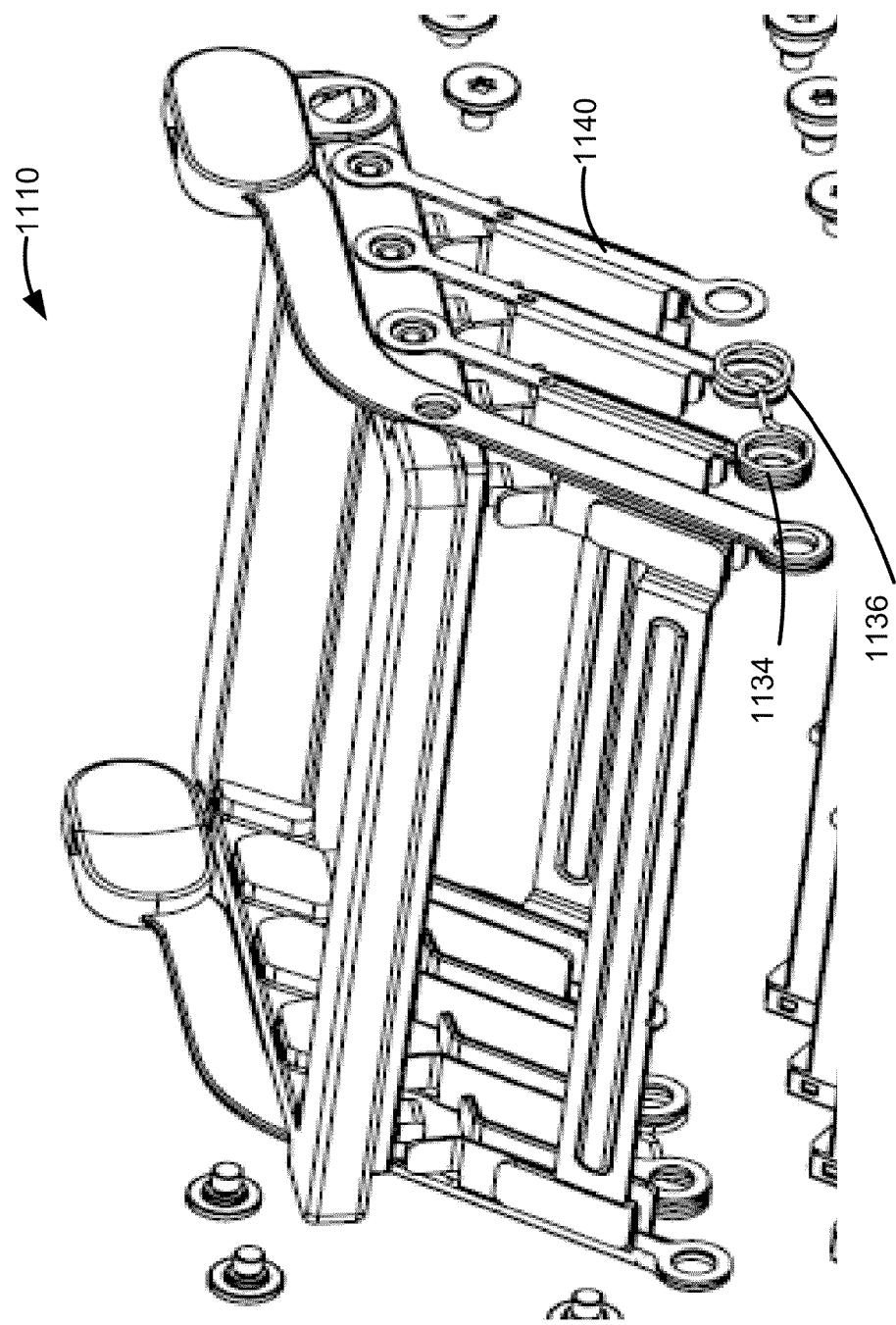
FIG. 46 illustrates a socket having a torsion spring with an additional compression coil according to an embodiment of the present invention.

FIG. 46 illustrates a socket having a torsion spring with an additional compression coil according to an embodiment of the present invention. In this example, torsion spring 1134 may be supplemented by additional compression coil 1136. Again, torsion spring 1134 and additional compression coil may maintain the switch in an open position unless the switch is positively closed. Their presence may also help to avoid vibrations in socket 1100 in both the open and closed states.

As can be seen in the above figures, sockets according to embodiments of the present invention may include several parts that need to be assembled together. To assist in this assembly, embodiments of the present invention may utilize assembly tools such as guides, alignment combs, or other tools. Examples are shown in the following figure.

Figure 47:
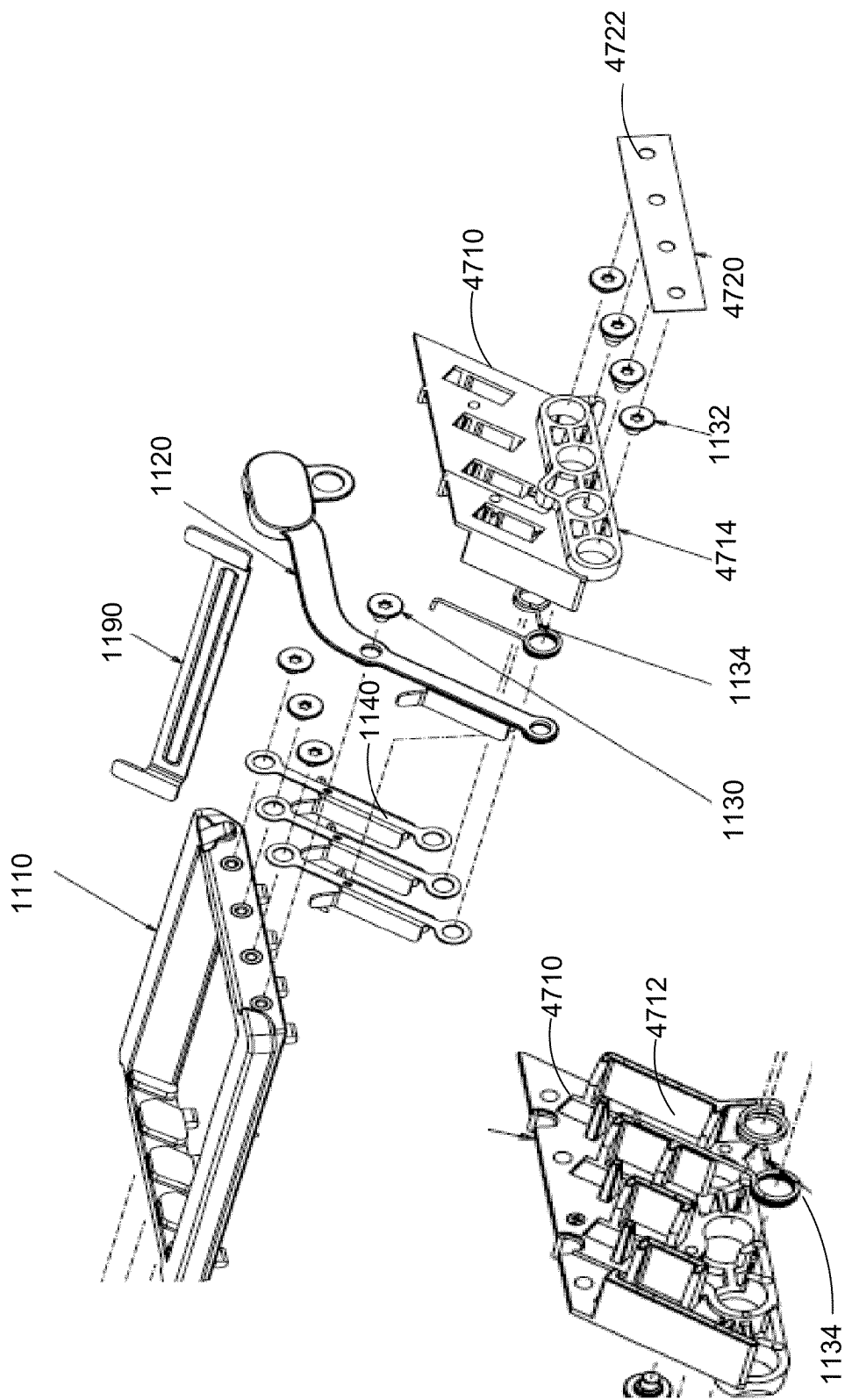
FIG. 47 illustrates portions of a socket and assembly tools that may be used to help assemble the socket according to an embodiment of the present invention.

FIG. 47 illustrates portions of a socket and assembly tools that may be used to help assemble the socket according to an embodiment of the present invention. In this example, alignment combs 4710 may be used to position portions of socket 1100, such as guides 1140 and lever 1120, during assembly.

Alignment combs 4710 may include a number of teeth 4712 to help align these structures. Alignment combs 4710 may include holders 4714 for holding pivot points 1132 in place as they are attached. Guide 4720 may include openings 4722 to accept a tool, such as an Allen wrench, that may be used to secure pivot points 1132 to receptacles (not shown.)

Figure 48:
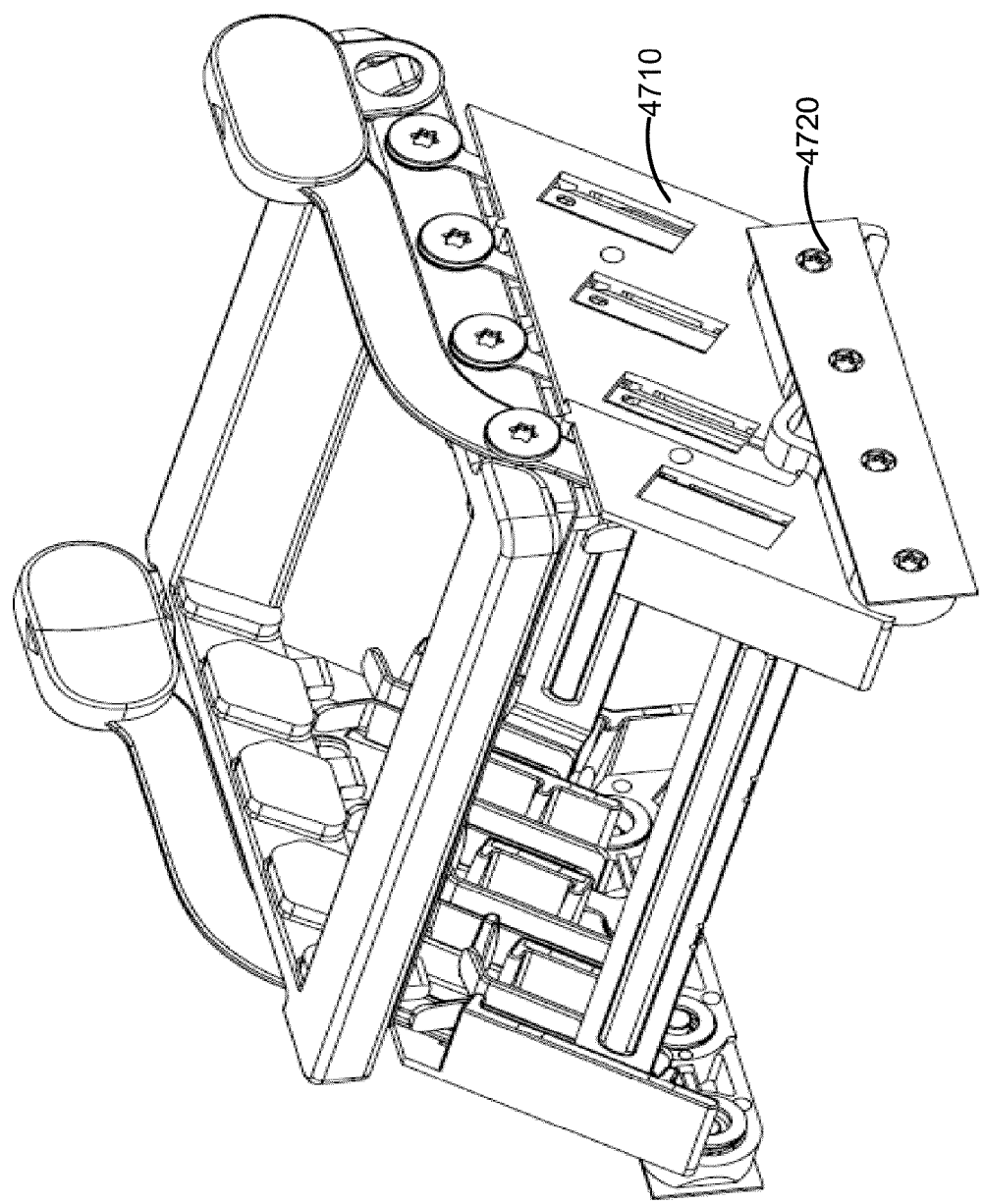
FIG. 48 illustrates a completed socket with assembly tools according to an embodiment of the present invention.

FIG. 48 illustrates a completed socket with assembly tools according to an embodiment of the present invention. Alignment combs 4710 and guides 4720 may be removed at this point.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A socket for providing electrical connections between a plurality of cards and a board, the socket comprising:
    a plurality of receptacles, wherein when the socket is in an open state, one or more of a plurality of cards may be inserted into or removed from the plurality of receptacles in the socket, and when a card is inserted in the socket, it is substantially orthogonal to the board and wherein when the socket is moved to a closed state, the card moves towards a position where the card is parallel to the board, and
    one or more levers and a frame, wherein the socket may be closed by applying force to the one or more levers and the socket may be locked in the closed state by placing a tab on each of the one or more levers under the frame of the socket, and wherein the socket may be opened by pushing each of the one or more levers away from the frame of the socket such that the tab on each of the one or more levers is not under the frame of the socket.

2. The socket of claim 1 wherein when the socket is in the open state, any of the plurality of cards may be removed from or inserted into any of the plurality of receptacles in the socket.

3. The socket of claim 2 wherein the board is a main logic board of a computer.

4. The socket of claim 1 wherein when the socket is closed, the card is at approximately a 45 degree angle to the board.

5. The socket of claim 1 wherein the socket may be closed by applying force to one or more levers.

6. The socket of claim 5 wherein the socket may be locked in a closed state by placing a tab on each of the one or more levers under a frame of the socket.

7. The socket of claim 6 wherein the socket may be opened by pushing each of the one or more levers away from the frame of the socket such that the tab on each of the one or more levers is not under the frame of the socket.

8. The socket of claim 1 wherein each of the receptacles are configured to accept a small-outline dual in-line memory module card.

9. The socket of claim 1 wherein each receptacle further comprises a plurality of contacts, each contact comprising:
    a serpentine portion to flex as the socket is opened and closed, the serpentine portion having a contact portion to make an electrical connection to a contact on a card; and
    a base portion to be substantially encased in a housing of the receptacle, wherein a portion of the base portion is removed to form a depression.

10. The socket of claim 9 wherein the serpentine portion is not substantially encased in the housing of the receptacle.

11. The socket of claim 9 wherein each of the contacts further comprises a contacting portion to form an electrical connection to a board.

12. The socket of claim 9 wherein the board is a main logic board of a computer.

13. The socket of claim 9 wherein each of the receptacles are configured to accept a small-outline dual in-line memory module card.

14. A socket that may be opened and closed, the socket comprising:
    a plurality of receptacles, each to accept a card;
    a plurality of guides to assist in the insertion of cards into the plurality of receptacles, each guide comprising:
    a funnel-like top to ease the insertion of a card into the guide;
    a dimple to fit into a cutout on a card and to provide a tactile response to a user while inserting the card when the socket is open; and
    a locking mechanism to hold the dimple in place when the socket is closed.

15. The socket of claim 14 wherein when a card is inserted into one of the plurality of receptacles, guides extend along a substantial portion of a side of the card.

16. The socket of claim 14 wherein each of the plurality of guides attach to a frame at a first end and one of the plurality of receptacles at a second end.

17. The socket of claim 16 wherein the plurality of guides are attached such that they may pivot relative to the frame and the plurality of receptacles.

18. The socket of claim 17 wherein the socket forms electrical connections between the cards and a board.

19. The socket of claim 18 wherein the board is a main logic board of a computer.

20. The socket of claim 14 wherein each of the receptacles are configured to accept a small-outline dual in-line memory module card.

21. A socket comprising:
    a first portion comprising a lever and a frame, wherein when the socket is opened, the lever is away from the frame, and when the socket is closed, the lever is in contact with the frame;
    a second portion comprising a plurality of guides, each guide having a funnel-shaped top and a dimple; and
    a third portion comprising a plurality of receptacles,
    wherein the guides are attached to the frame and a receptacle at pivot points.

22. The socket of claim 21 wherein when the socket is open, a user may insert and extract cards into and from any of the plurality of receptacles.

23. The socket of claim 21 wherein the lever is formed with one of the guides.

24. The socket of claim 23, further comprising a second lever, wherein the levers are along an outside edge of the socket, and the levers are biased towards the inside of the socket.

25. A socket that may be opened and closed, the socket comprising:
    a plurality of receptacles, each to accept a card;
    a plurality of guides to assist in the insertion of cards into the plurality of receptacles, each guide comprising:
    a funnel-like top to ease the insertion of a card into the guide; and a locking mechanism to hold the dimple in place when the socket is closed; and a plurality of stabilizing bars, each located between two of the plurality of guides.

26. The socket of claim 25 wherein when a card is inserted into one of the plurality of receptacles, guides extend along a substantial portion of a side of the card.

27. The socket of claim 25 wherein the plurality of guides attach to a frame at a first end and one of the plurality of receptacles at a second end.

28. The socket of claim 27 wherein the plurality of guides are attached such that they may pivot relative to the frame and the plurality of receptacles.

29. The socket of claim 28 wherein the socket forms electrical connections between the cards and a board.

30. The socket of claim 29 wherein the board is a main logic board of a computer.

31. The socket of claim 25 wherein each of the plurality of receptacles are configured to accept a small-outline dual in-line memory module card.

32. A socket comprising:
a first portion comprising a lever and a frame, wherein when the socket is opened, the lever is away from the frame, and when the socket is closed, the lever is in contact with the frame, wherein the lever includes a thumb tab, the thumb tab located near an end of the lever;
a second portion comprising a plurality of guides and stabilizing bars, each guide having a funnel-shaped and the stabilizing bars connected between two of the pluralities of guides; and
a third portion comprising a plurality of receptacles,
wherein the guides are attached to the frame and a receptacle at pivot points.

33. The socket of claim 32 wherein when the socket is open, a user may insert and extract cards into and from any of the plurality of receptacles.

34. The socket of claim 32 wherein the lever is formed with one of the guides.

35. The socket of claim 34, further comprising a second lever, wherein the levers are along an outside edge of the socket, and the levers are biased towards the inside of the socket.

* * * * *